US 10,762,935 B2

(12) United States Patent
Kwak et al.

(10) Patent No.: US 10,762,935 B2
(45) Date of Patent: Sep. 1, 2020

(54) SEMICONDUCTOR DEVICES

(71) Applicant: SK hynix Inc., Icheon-si Gyeonggi-do (KR)

(72) Inventors: Myung Kyun Kwak, Yongin-si (KR); Woongrae Kim, Icheon-si (KR); Seung Hun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/400,680

(22) Filed: May 1, 2019

(65) Prior Publication Data

US 2020/0160896 A1    May 21, 2020

(30) Foreign Application Priority Data

Nov. 15, 2018  (KR) .......................... 10-2018-0140758

(51) Int. Cl.
*G11C 7/00* (2006.01)
*G11C 7/12* (2006.01)
*G11C 7/22* (2006.01)

(52) U.S. Cl.
CPC . *G11C 7/12* (2013.01); *G11C 7/22* (2013.01)

(58) Field of Classification Search
CPC .................................................. G11C 11/4076

USPC ....................................................... 365/233.1
See application file for complete search history.

(56) References Cited

U.S. PATENT DOCUMENTS

| 2008/0056038 | A1* | 3/2008 | Jeong | ............. G11C 7/1045 365/203 |
| 2008/0301391 | A1 | 12/2008 | Oh | |
| 2010/0302872 | A1* | 12/2010 | Lee | ............. G11C 7/1027 365/189.05 |
| 2011/0158032 | A1* | 6/2011 | Kang | ............. G11C 7/1018 365/233.16 |

FOREIGN PATENT DOCUMENTS

KR          101005114 B1    12/2010

* cited by examiner

*Primary Examiner* — Min Huang
(74) *Attorney, Agent, or Firm* — William Park & Associates Ltd.

(57) ABSTRACT

A semiconductor device includes a burst end signal generation circuit and an auto-pre-charge control circuit. The burst end signal generation circuit generates a write burst end signal based on a write flag and a latched burst mode signal in a first burst mode and generates the write burst end signal based on an internal write flag and an internal latched burst mode signal in a second burst mode. The auto-pre-charge control circuit performs an auto-pre-charge operation based on the write burst end signal.

23 Claims, 22 Drawing Sheets

SEMICONDUCTOR DEVICES

CROSS-REFERENCE TO RELATED APPLICATIONS

The present application claims priority under 35 U.S.C. 119(a) to Korean Application No. 10-2018-0140758, filed on Nov. 15, 2018, which is incorporated herein by reference in its entirety.

BACKGROUND

1. Technical Field

Embodiments of the present disclosure relate to semiconductor devices controlling a burst operation according to a burst length.

2. Related Art

Semiconductor devices perform a write operation for storing data into cell arrays or a read operation for outputting the data stored in the cell arrays. The semiconductor devices may perform an auto-pre-charge operation after receiving or outputting data having one or more bits, the number of which is set according to a burst length, if the write operation or the read operation is performed.

SUMMARY

According to an embodiment, a semiconductor device includes a burst end signal generation circuit and an auto-pre-charge control circuit. The burst end signal generation circuit generates a write burst end signal based on a write flag and a latched burst mode signal in a first burst mode and generates the write burst end signal based on an internal write flag and an internal latched burst mode signal in a second burst mode. The auto-pre-charge control circuit performs an auto-pre-charge operation based on the write burst end signal. The internal write flag is generated by shifting the write flag by a first period determined based on a shift control signal, and the internal latched burst mode signal is generated by shifting the latched burst mode signal by a second period determined based on the shift control signal.

According to another embodiment, a semiconductor device includes a flag shift circuit configured to shift a write flag by a first period determined based on a shift control signal to generate an internal write flag, a burst mode signal latch circuit configured to latch a burst mode signal based on an input control signal and configured to output the latched signal of the burst mode signal as a latched burst mode signal based on an output control signal, a burst mode signal shift circuit configured to shift the latched burst mode signal by a second period determined based on the shift control signal to generate an internal latched burst mode signal, and a burst end signal generation circuit configured to generate a write burst end signal based on the write flag and the latched burst mode signal in a first burst mode and configured to generate the write burst end signal based on the internal write flag and the internal latched burst mode signal in a second burst mode.

According to yet another embodiment, a semiconductor device includes a flag shift circuit configured to shift a read flag by a first period determined based on a shift control signal to generate an internal read flag, a burst mode signal shift circuit configured to shift a burst mode signal by a second period determined based on the shift control signal to generate an internal burst mode signal, and a burst end signal generation circuit configured to generate a read burst end signal based on the read flag and the burst mode signal in a first burst mode and configured to generate the read burst end signal based on the internal read flag and the internal burst mode signal in a second burst mode.

DETAILED DESCRIPTION OF THE EMBODIMENTS

Various embodiments of the present disclosure are described below with reference to the accompanying drawings. However, the embodiments described herein are for illustrative purposes only and are not intended to limit the scope of the present disclosure.

Semiconductor devices including a plurality of banks may provide various bank modes, such as a bank group mode, an 8-bank mode, and a 16-bank mode. The plurality of banks may constitute a bank group. For example, four banks may constitute one bank group. In the bank group mode, a column operation for one bank included in the bank group may be performed by one command. In the 8-bank mode, column operations for two banks respectively included in two separate bank groups may be sequentially performed by one command. In the 16-bank mode, column operations for four banks respectively included in four separate bank groups may be sequentially performed by one command.

Figure 1:
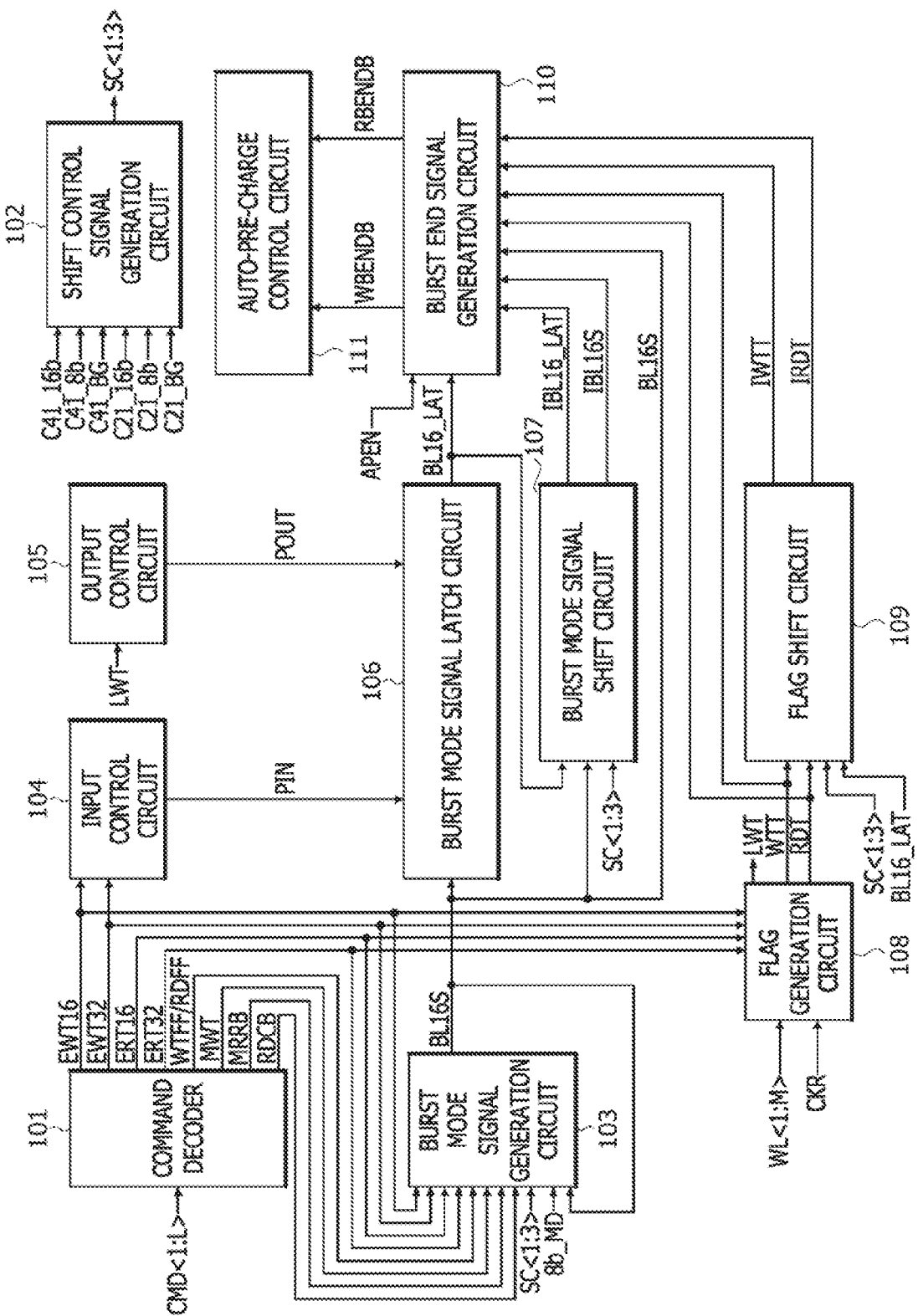
FIG. 1 shows a block diagram illustrating a configuration of a semiconductor device, according to an embodiment of the present disclosure.

As illustrated in FIG. 1, a semiconductor device 10, according to an embodiment, may include a command decoder 101, a shift control signal generation circuit 102, a burst mode signal generation circuit 103, an input control circuit 104, an output control circuit 105, a burst mode signal latch circuit 106, a burst mode signal shift circuit 107, a flag generation circuit 108, a flag shift circuit 109, a burst end signal generation circuit 110, and an auto-pre-charge control circuit 111.

The command decoder 101 may decode a command CMD<1:L> to generate a first write signal EWT16, a second write signal EWT32, a first read signal ERT16, a second read signal ERT32, a test write/read signal WTFF/RDFF, a mask write signal MWT, a mode register read signal MRRB, and a read data control signal RDCB. The first write signal EWT16 may be generated to perform a write operation while a burst length is set to be "16." In the burst length, "16" means that a binary data stream including sixteen bits is inputted to or outputted from the semiconductor device 10 by one command. A logic level combination of the command CMD<1:L> for generating the first write signal EWT16 may be set to be different for different embodiments. The second write signal EWT32 may be generated to perform the write operation while the burst length is set to be "32." In the burst length, "32" means that a binary data stream including thirty-two bits is inputted to or outputted from the semiconductor device 10 by one command. A logic level combination of the command CMD<1:1:L> for generating the second write signal EWT32 may be set to be different for different embodiments. A status having the burst length of sixteen may be referred to as a first burst mode, and a status having the burst length of thirty-two may be referred to as a second burst mode.

The first read signal ERT16 may be generated to perform a read operation while the burst length is set to be "16." A logic level combination of the command CMD<1:L> for generating the first read signal ERT16 may be set to be different for different embodiments. The second read signal ERT32 may be generated to perform the read operation while the burst length is set to be "32." A logic level combination of the command CMD<1:L> for generating the second read signal ERT32 may be set to be different for different embodiments. The test write/read signal WTFF/RDFF may be generated to receive or output information on test during the write operation or the read operation. The mask write signal MWT may be generated to perform a mask write operation while the burst length is set to be "16." A logic level combination of the command CMD<1:L> for generating the mask write signal MWT may be set to be different for different embodiments. The mode register read signal MRRB may be generated to perform a mode register operation while the burst length is set to be "16." A logic level combination of the command CMD<1:L> for generating the mode register read signal MRRB may be set to be different for different embodiments. The read data control signal RDCB may be generated to perform a read data calibration operation while the burst length is set to be "16." A logic level combination of the command CMD<1:L> for generating the read data control signal RDCB may be set to be different for different embodiments.

The shift control signal generation circuit 102 may generate first to third shift control signals SC<1:3> based on a first status information signal C41_16b, a second status information signal C41_8b, a third status information signal C41_BG, a fourth status information signal C21_16b, a fifth status information signal C21_8b, and a sixth status information signal C21_BG. The shift control signal generation circuit 102 may selectively generate or activate one of the first to third shift control signals SC<1:3> based on a ratio of a frequency of a data clock signal (WCK of FIG. 22) to a frequency of an internal clock signal (ICLK of FIG. 11) as well as information on the bank mode and the burst length which are employed in a column operation. If a frequency ratio of the data clock signal WCK to the internal clock signal ICLK is "K," it means that a frequency of the data clock signal WCK is set to be "K" times a frequency of the internal clock signal ICLK (where, "K" may be set as a natural number). The column operation may include the write operation and the read operation. The bank mode employed in the column operation may be set as one of the bank group mode, the 8-bank mode, and the 16-bank mode. The first status information signal C41_16b, the second status information signal C41_8b, the third status information signal C41_BG, the fourth status information signal C21_16b, the fifth status information signal C21_8b, and the sixth status information signal C21_BG may be generated by decoding the information on the bank mode and the burst length which are stored in a mode register (not shown).

The shift control signal generation circuit 102 may generate the first shift control signal SC<1> of the first to third shift control signals SC<1:3> if the first status information signal C41_16b or the second status information signal C41_8b is generated. The first status information signal C41_16b may be generated while a frequency ratio of the data clock signal WCK to the internal clock signal ICLK is set as four, the column operation is performed in the 16-bank mode, and the burst length is set to be thirty-two. The second status information signal C41_8b may be generated while a frequency ratio of the data clock signal WCK to the internal clock signal ICLK is set as four, the column operation is performed in the 8-bank mode, and the burst length is set to be thirty-two. Logic levels of the first status information signal C41_16b, the second status information signal C41_8b, and the first shift control signal SC<1> may be set to be different for different embodiments.

The shift control signal generation circuit 102 may generate the second shift control signal SC<2> of the first to third shift control signals SC<1:3> if one of the third status information signal C41_BG, the fourth status information signal C21_16b, and the fifth status information signal C21_8b is generated. The third status information signal C41_BG may be generated while a frequency ratio of the data clock signal WCK to the internal clock signal ICLK is set as four, the column operation is performed in the bank group mode, and the burst length is set to be thirty-two. The fourth status information signal C21_16b may be generated while a frequency ratio of the data clock signal WCK to the internal clock signal ICLK is set as two, the column operation is performed in the 16-bank mode, and the burst length is set to be thirty-two. The fifth status information signal C21_8b may be generated while a frequency ratio of the data clock signal WCK to the internal clock signal ICLK is set as two, the column operation is performed in the 8-bank mode, and the burst length is set to be thirty-two. Logic levels of the third status information signal C41_BG, the fourth status information signal C21_16b, the fifth status information signal C21_8b, and the second shift control signal SC<2> may be set to be different for different embodiments.

The shift control signal generation circuit 102 may generate the third shift control signal SC<3> of the first to third shift control signals SC<1:3> if the sixth status information signal C21_BG is generated. The sixth status information signal C21_BG may be generated while a frequency ratio of the data clock signal WCK to the internal clock signal ICLK is set as two, the column operation is performed in the bank group mode, and the burst length is set to be thirty-two. Logic levels of the sixth status information signal C21_BG and the third shift control signal SC<3> may be set to be different for different embodiments. A configuration and an operation of the shift control signal generation circuit 102 are described more fully below with reference to FIG. 2.

The burst mode signal generation circuit 103 may generate a burst mode signal BL16S based on the first write signal EWT16, the second write signal EWT32, the first read signal ERT16, the second read signal ERT32, the test write/read signal WTFF/RDFF, the mask write signal MWT, the mode register read signal MRRB, the read data control signal RDCB, the first to third shift control signals SC<1:3>, a mode information signal 8b_MD, and the burst mode signal BL16S. The mode information signal 8b_MD may be stored in the mode register (not shown). The burst mode signal generation circuit 103 may generate the burst mode signal BL16S which is set to have a first logic level if the write operation or the read operation is performed while the burst length is set to be "16." The burst mode signal generation circuit 103 may generate the burst mode signal BL16S which is set to have the first logic level if the mask write operation or a mode register read operation is performed while the burst length is set to be "16." The burst mode signal generation circuit 103 may generate the burst mode signal BL16S which is set to have the first logic level if the read data calibration operation is performed while the burst length is set to be "16." The burst mode signal generation circuit 103 may generate the burst mode signal BL16S which is set to have a second logic level if the write operation or the read operation is performed while the burst length is set to be "32." The burst mode signal generation circuit 103 may generate the burst mode signal BL16S which is set to have the second logic level if the write operation or the read operation is performed in the 8-bank mode. In the present embodiment, the first logic level may be a logic "high" level and the second logic level may be a logic "low" level. A configuration and an operation of the burst mode signal generation circuit 103 are described more fully below with reference to FIGS. 3 to 8.

The input control circuit 104 may generate an input control signal PIN based on the first write signal EWT16 and the second write signal EWT32. The input control circuit 104 may generate the input control signal PIN if the first write signal EWT16 or the second write signal EWT32 is generated. In the present embodiment, the input control signal PIN may be a pulse having a logic "high" level. The level transition of the input control signal PIN may occur if the first write signal EWT16 or the second write signal EWT32 is generated, according to embodiment. A configuration and an operation of the input control circuit 104 are described more fully below with reference to FIG. 9.

The output control circuit 105 may generate an output control signal POUT based on a pre-write flag LWT. The output control circuit 105 may generate the output control signal POUT if the pre-write flag LWT is generated. In the present embodiment, the output control signal POUT may be a pulse having a logic "high" level. The level transition of the output control signal POUT may occur if the first read signal ERT16 or the second read signal ERT32 is generated, according to embodiment.

The burst mode signal latch circuit 106 may latch the burst mode signal BL16S and may output the latched signal of the burst mode signal BL16S as a latched burst mode signal BL16_LAT, based on the input control signal PIN and the output control signal POUT. The burst mode signal latch circuit 106 may latch the burst mode signal BL16S if the input control signal PIN is generated. The burst mode signal latch circuit 106 may latch the burst mode signal BL16S if the write operation is performed while the burst length is set to be "16" or "32." The burst mode signal latch circuit 106 may output the latched signal of the burst mode signal BL16S as the latched burst mode signal BL16_LAT if the output control signal POUT is generated. The burst mode signal latch circuit 106 may output the latched signal of the burst mode signal BL16S as the latched burst mode signal BL16_LAT if the pre-write flag LWT is generated.

The burst mode signal shift circuit 107 may shift the burst mode signal BL16S and the latched burst mode signal BL16_LAT based on the first to third shift control signals SC<1:3> to generate an internal latched burst mode signal IBL16_LAT and an internal burst mode signal IBL16S. The burst mode signal shift circuit 107 may shift the burst mode signal BL16S by a period determined based on the first to third shift control signals SC<1:3> to generate the internal burst mode signal IBL16S. For example, the burst mode signal shift circuit 107 may shift the burst mode signal BL16S by two cycles of the internal clock signal ICLK to generate the internal burst mode signal IBL16S if the first shift control signal SC<1> is generated, may shift the burst mode signal BL16S by four cycles of the internal dock signal ICLK to generate the internal burst mode signal IBL16S if the second shift control signal SC<2> is generated, and may shift the burst mode signal BL16S by eight cycles of the internal clock signal ICLK to generate the internal burst mode signal IBL16S if the third shift control signal SC<3> is generated. The burst mode signal shift circuit 107 may shift the latched burst mode signal BL16_LAT by a period determined based on the first to third shift control signals SC<1:3> to generate the internal latched burst mode signal IBL16_LAT. For example, the burst mode signal shift circuit 107 may shift the latched burst mode signal BL16_LAT by two cycles of the internal clock signal ICLK to generate the internal latched burst mode signal IBL16_LAT if the first shift control signal SC<1> is generated, may shift the latched burst mode signal BL16_LAT by four cycles of the internal clock signal ICLK to generate the internal latched burst mode signal IBL16_LAT if the second shift control signal SC<2> is generated, and may shift the latched burst mode signal BL16_LAT by eight cycles of the internal clock signal ICLK to generate the internal latched burst mode signal IBL16_LAT if the third shift control signal SC<3> is generated. A configuration and an operation of the burst mode signal shift circuit 107 are described more fully below with reference to FIGS. 10 to 12.

The flag generation circuit 108 may generate the pre-write flag LWT and a write flag WTT from the first write signal EWT16 and the second write signal EWT32 based on a write latency signal WL<1:M> and a clock information signal CKR. The flag generation circuit 108 may sequentially generate the pre-write flag LWT and the write flag WTT after a period determined based on the write latency signal WL<1:M> and the clock information signal CKR elapses from a point in time when the first write signal EWT16 or the second write signal EWT32 is generated. For example, the flag generation circuit 108 may generate the pre-write flag LWT at a point in time when a write latency period and a clock information setup period elapse from a point in time when the first write signal EWT16 or the second write signal EWT32 is generated and may generate the write flag WTT at a point in time when one cycle of the internal clock signal ICLK elapses from a point in time when the pre-write flag LWT is generated. The points in time when the pre-write flag LWT and the write flag WTT are generated may be set to be different for different embodiments. The write latency period may be set by a logic level combination of the write latency signal WL<1:M>. The write latency signal WL<1:M> may be extracted from information stored in the mode register (not shown). The clock information setup period may be a period which is set based on a logic level of the clock information signal CKR. For example, the clock information setup period may be set as a period corresponding to two cycles of the internal clock signal ICLK if the clock information signal CKR has a logic "low" level, and the clock information setup period may be set as a period corresponding to four cycles of the internal clock signal ICLK if the clock information signal CKR has a logic "high" level. The dock information signal CKR may be set to have a logic "low" level if a frequency ratio of the data clock signal WCK to the internal clock signal ICLK is four and may be set to have a logic "high" level if a frequency ratio of the data clock signal WCK to the internal clock signal ICLK is two. The write latency period and the clock information setup period may be set to be different for different embodiments.

The flag generation circuit 108 may generate a read flag RDT from the first read signal ERT16 and the second read signal ERT32. The flag generation circuit 108 may generate the read flag RDT if the first read signal ERT16 or the second read signal ERT32 is generated. For example, the flag generation circuit 108 may generate the read flag RDT at a point in time when one cycle of the internal clock signal ICLK elapses from a point in time when the first read signal ERT16 or the second read signal ERT32 is generated. The point in time when the read flag RDT is generated may be set to be different for different embodiments. A configuration and an operation of the flag generation circuit 108 are described more fully below with reference to FIGS. 13 and 14.

The flag shift circuit 109 may generate an internal write flag IWTT from the write flag WTT based on the latched burst mode signal BL16_LAT and the first to third shift control signals SC<1:3>. The flag shift circuit 109 may shift the write flag WTT by a period determined by the first to third shift control signals SC<1:3> to generate the internal write flag IWTT, while the latched burst mode signal BL16_LAT is set to have the second logic level by the write operation performed in the 8-bank mode or by the write operation performed while the burst length is set to be "32." For example, the flag shift circuit 109 may shift the write flag WTT by two cycles of the internal clock signal ICLK to generate the internal write flag IWTT if the first shift control signal SC<1> is generated, may shift the write flag WTT by four cycles of the internal clock signal ICLK to generate the internal write flag IWTT if the second shift control signal SC<2> is generated, and may shift the write flag WTT by eight cycles of the internal clock signal ICLK to generate the internal write flag IWTT if the third shift control signal SC<3> is generated.

The flag shift circuit 109 may generate an internal read flag IRDT from the read flag RDT based on the latched burst mode signal BL16_LAT and the first to third shift control signals SC<1:3>. The flag shift circuit 109 may shift the read flag RDT by a period determined by the first to third shift control signals SC<1:3> to generate the internal read flag IRDT, while the latched burst mode signal BL16_LAT is set to have the second logic level by the read operation performed in the 8-bank mode or by the read operation performed while the burst length is set to be "32." For example, the flag shift circuit 109 may shift the read flag RDT by two cycles of the internal clock signal ICLK to generate the internal read flag IRDT if the first shift control signal SC<1> is generated, may shift the read flag RDT by four cycles of the internal clock signal ICLK to generate the internal read flag IRDT if the second shift control signal SC<2> is generated, and may shift the read flag RDT by eight cycles of the internal clock signal ICLK to generate the internal read flag IRDT if the third shift control signal SC<3> is generated. A configuration and an operation of the flag shift circuit 109 are described more fully below with reference to FIGS. 15 to 17.

The burst end signal generation circuit 110 may generate a write burst end signal WBENDB based on the write flag WTT, the latched burst mode signal BL16_LAT, the internal write flag IWTT, the internal latched burst mode signal IBL16_LAT, and an auto-pre-charge enablement signal APEN. The burst end signal generation circuit 110 may latch the auto-pre-charge enablement signal APEN to generate the write burst end signal WBENDB after the write flag WTT and the latched burst mode signal BL16_LAT have predetermined logic levels, respectively. The burst end signal generation circuit 110 may latch a delayed auto-pre-charge enablement signal (APENd of FIG. 19) to generate the write burst end signal WBENDB after the internal write flag IWTT and the internal latched burst mode signal IBL16_LAT have predetermined logic levels, respectively. The burst end signal generation circuit 110 may latch the auto-pre-charge enablement signal APEN based on the write flag WTT to generate the write burst end signal WBENDB for terminating a burst operation, if the write operation is performed while the burst length is set to be "16." The burst end signal generation circuit 110 may latch the delayed auto-pre-charge enablement signal APENd based on the internal write flag IWTT to generate the write burst end signal WBENDB for terminating the burst operation, if the write operation is performed while the burst length is set to be "32" or the write operation is performed while the bank mode is set to be the 8-bank mode.

The burst end signal generation circuit 110 may generate a read burst end signal RBENDB based on the read flag RDT, the burst mode signal BL16S, the internal read flag IRDT, the internal burst mode signal IBL16S, and the auto-pre-charge enablement signal APEN. The burst end signal generation circuit 110 may latch the auto-pre-charge enablement signal APEN to generate the read burst end signal RBENDB after the read flag RDT and the burst mode signal BL16S have predetermined logic levels, respectively. The burst end signal generation circuit 110 may latch the delayed auto-pre-charge enablement signal APENd to generate the read burst end signal RBENDB after the internal read flag IRDT and the internal burst mode signal IBL16S have predetermined logic levels, respectively. The burst end signal generation circuit 110 may latch the auto-pre-charge enablement signal APEN based on the read flag RDT to generate the read burst end signal RBENDB for terminating the burst operation, if the read operation is performed while the burst length is set to be "16." The burst end signal generation circuit 110 may latch the delayed auto-pre-charge enablement signal APENd based on the internal read flag IRDT to generate the read burst end signal WBENDB for terminating the burst operation, if the read operation is performed while the burst length is set to be "32" or the read operation is performed while the bank mode is set to be the 8-bank mode. A configuration and an operation of the burst end signal generation circuit 110 are described more fully below with reference to FIGS. 18 to 21.

The auto-pre-charge control circuit 111 may perform the auto-pre-charge operation if the write burst end signal WBENDB or the read burst end signal RBENDB is generated. The auto-pre-charge control circuit 111 may perform the auto-pre-charge operation in response to the write burst end signal WBENDB which is generated by latching the auto-pre-charge enablement signal APEN based on the write flag WTT if the write operation is performed while the burst length is set to be "16." The auto-pre-charge control circuit 111 may perform the auto-pre-charge operation in response to the write burst end signal WBENDB which is generated by latching the delayed auto-pre-charge enablement signal APENd based on the internal write flag IWTT if the write operation is performed while the burst length is set to be "32" or the write operation is performed while the bank mode is set as the 8-bank mode. The auto-pre-charge control circuit 111 may perform the auto-pre-charge operation in response to the read burst end signal RBENDB which is generated by latching the auto-pre-charge enablement signal APEN based on the read flag RDT if the read operation is performed while the burst length is set to be "16," The auto-pre-charge control circuit 111 may perform the auto-pre-charge operation in response to the read burst end signal RBENDB which is generated by latching the delayed auto-pre-charge enablement signal APENd based on the internal read flag IRDT if the read operation is performed while the burst length is set to be "32" or the read operation is performed while the bank mode is set as the 8-bank mode.

Figure 2:
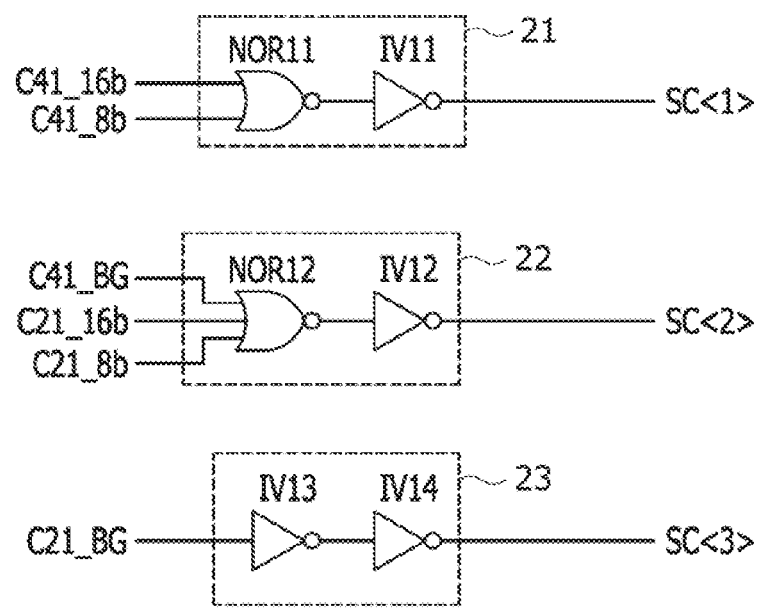
FIG. 2 shows a circuit diagram illustrating an example of a shift control signal generation circuit included in the semiconductor device of FIG. 1.

Referring to FIG. 2, the shift control signal generation circuit 102 may include a first shift control signal generation circuit 21, a second shift control signal generation circuit 22, and a third shift control signal generation circuit 23. The first shift control signal generation circuit 21 may include a NOR gate NOR11 and an inverter IV11. The first shift control signal generation circuit 21 may perform a logical OR operation of the first status information signal C41_16b and the second status information signal C41_8b to generate the first shift control signal SC<1>, The second shift control signal generation circuit 22 may include a NOR gate NOR12 and an inverter IV12. The second shift control signal generation circuit 22 may perform a logical OR operation of the third status information signal C41_BG, the fourth status information signal C21_16b, and the fifth status information signal C21_8b to generate the second shift control signal SC<2>. The third shift control signal generation circuit 23 may include a third inverter IV13 and a fourth inverter IV14 which are cascaded. The third shift control signal generation circuit 23 may buffer the sixth status information signal C21_BG to generate the third shift control signal SC<3>.

The shift control signal generation circuit 102 may generate the first shift control signal SC<1> while the first status information signal C41_16b is generated by setting a frequency ratio of the data clock signal WCK to the internal clock signal ICLK as four, performing the column operation in the 16-bank mode, and setting the burst length as "32." The shift control signal generation circuit 102 may generate the first shift control signal SC<1> while the second status information signal C41_8b is generated by setting a frequency ratio of the data clock signal WCK to the internal clock signal ICLK as four, performing the column operation in the 8-bank mode, and setting the burst length as "32." The shift control signal generation circuit 102 may generate the second shift control signal SC<2> while the third status information signal C41_BG is generated by setting a frequency ratio of the data clock signal WCK to the internal clock signal ICLK as four, performing the column operation in the bank group mode, and setting the burst length as "32." The shift control signal generation circuit 102 may generate the second shift control signal SC<2> while the fourth status information signal C21_16b is generated by setting a frequency ratio of the data clock signal WCK to the internal clock signal ICLK as two, performing the column operation in the 16-bank mode, and setting the burst length as "32." The shift control signal generation circuit 102 may generate the second shift control signal SC<2> while the fifth status information signal C21_8b is generated by setting a frequency ratio of the data clock signal WCK to the internal clock signal ICLK as two, performing the column operation in the 8-bank mode, and setting the burst length as "32." The shift control signal generation circuit 102 may generate the third shift control signal SC<3> while the sixth status information signal C21_BG is generated by setting a frequency ratio of the data clock signal WCK to the internal clock signal ICLK as two, performing the column operation in the bank group mode, and setting the burst length as "32."

Figure 3:
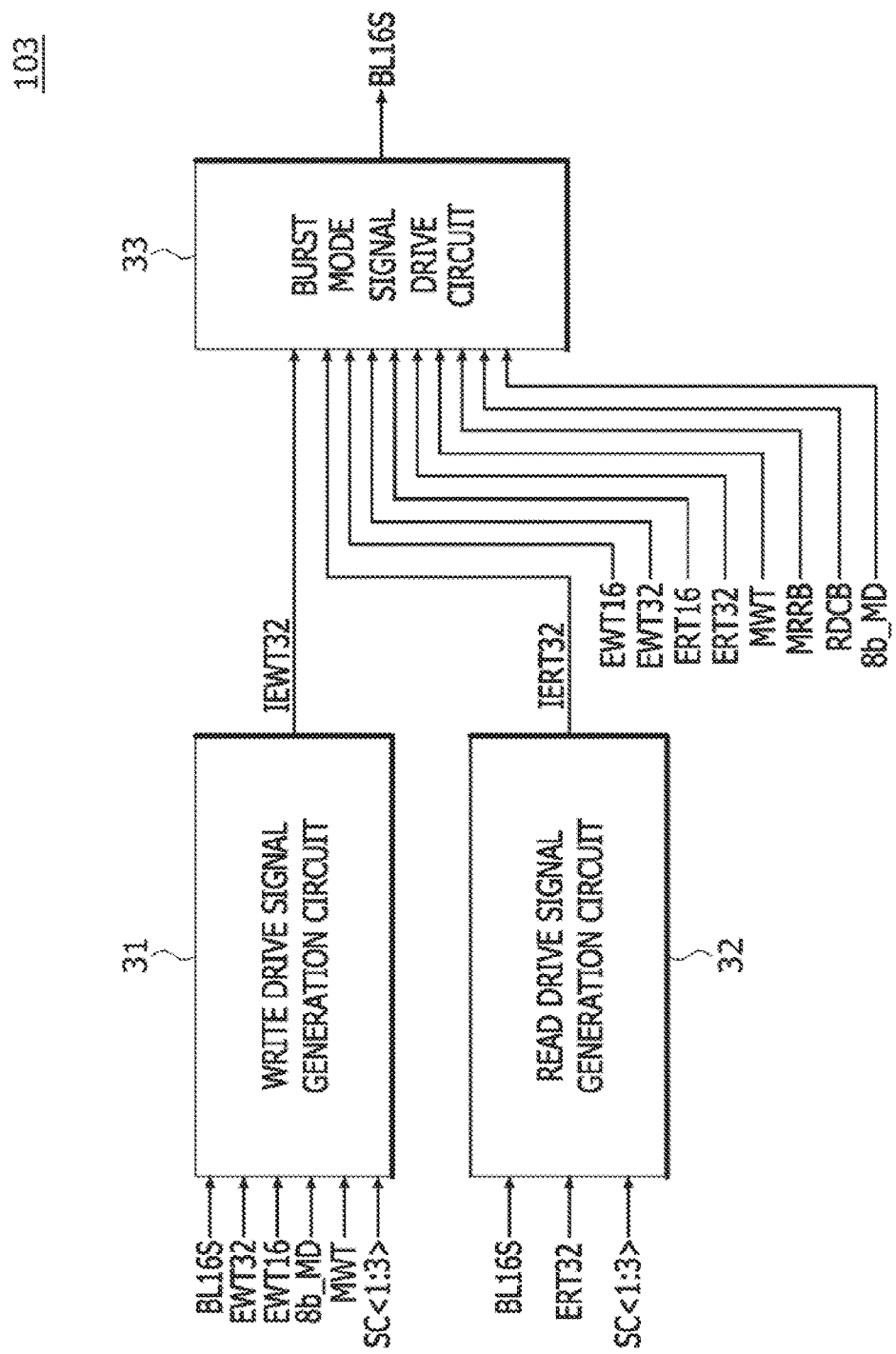
FIG. 3 shows a block diagram illustrating an example of a burst mode signal generation circuit included in the semiconductor device of FIG. 1.

Referring to FIG. 3, the burst mode signal generation circuit 103 may include a write drive signal generation circuit 31, a read drive signal generation circuit 32, and a burst mode signal drive circuit 33.

The write drive signal generation circuit 31 may generate a write drive signal IEWT32 based on the burst mode signal BL16S, the second write signal EWT32, the first write signal EWT16, the mode information signal 8b_MD, the mask write signal MWT, and the first to third shift control signals SC<1:3>. The write drive signal generation circuit 31 may generate the write drive signal IEWT32 at a point in time when a period determined by the first to third shift control signals SC<1:3> elapses from a point in time when the write operation is performed while the burst length is set to be "32" or the write operation or the mask write operation is performed while the bank mode is set as the 8-bank mode. A configuration and an operation of the write drive signal generation circuit 31 are described more fully below with reference to FIGS. 4 to 6.

The read drive signal generation circuit 32 may generate a read drive signal IERT32 based on the burst mode signal BL16S, the second read signal ERT32, and the first to third shift control signals SC<1:3>. The read drive signal generation circuit 32 may generate the read drive signal IERT32 if the read operation is performed while the burst length is set to be "32." A configuration and an operation of the read drive signal generation circuit 32 are described more fully below with reference to FIG. 7.

The burst mode signal drive circuit 33 may drive the burst mode signal BL16S based on the write drive signal IEWT32, the read drive signal IERT32, the first write signal EWT16, the second write signal EWT32, the first read signal ERT16, the second read signal ERT32, the mask write signal MWT, the test write/read signal WTFF/RDFF, the mode register read signal MRRB, the read data control signal RDCB, and the mode information signal 8b_MD. The burst mode signal generation circuit 103 may generate the burst mode signal BL16S which is set to have a first logic level if the write operation is performed while the burst length is set to be "32" or the read operation is performed while the burst length is set to be "16." The burst mode signal generation circuit 103 may generate the burst mode signal BL16S which is set to have the first logic level if the mask write operation is performed while the burst length is set to be "16" or the mode register operation is performed while the burst length is set to be "16." The burst mode signal generation circuit 103 may generate the burst mode signal BL16S which is set to have the first logic level if the read data calibration operation is performed while the burst length is set to be "16." The burst mode signal generation circuit 103 may generate the burst mode signal BL16S which is set to have a second logic level if the write operation or the read operation is performed while the burst length is set to be "32." The burst mode signal generation circuit 103 may generate the burst mode signal BL16S which is set to have the second logic level if the write operation or the read operation is performed in the 8-bank mode. In the present embodiment, the first logic level may be set to have a logic "high" level and the second logic level may be set to have a logic "low" level. A configuration and an operation of the burst mode signal drive circuit 33 are described more fully below with reference to FIG. 8.

Figure 4:
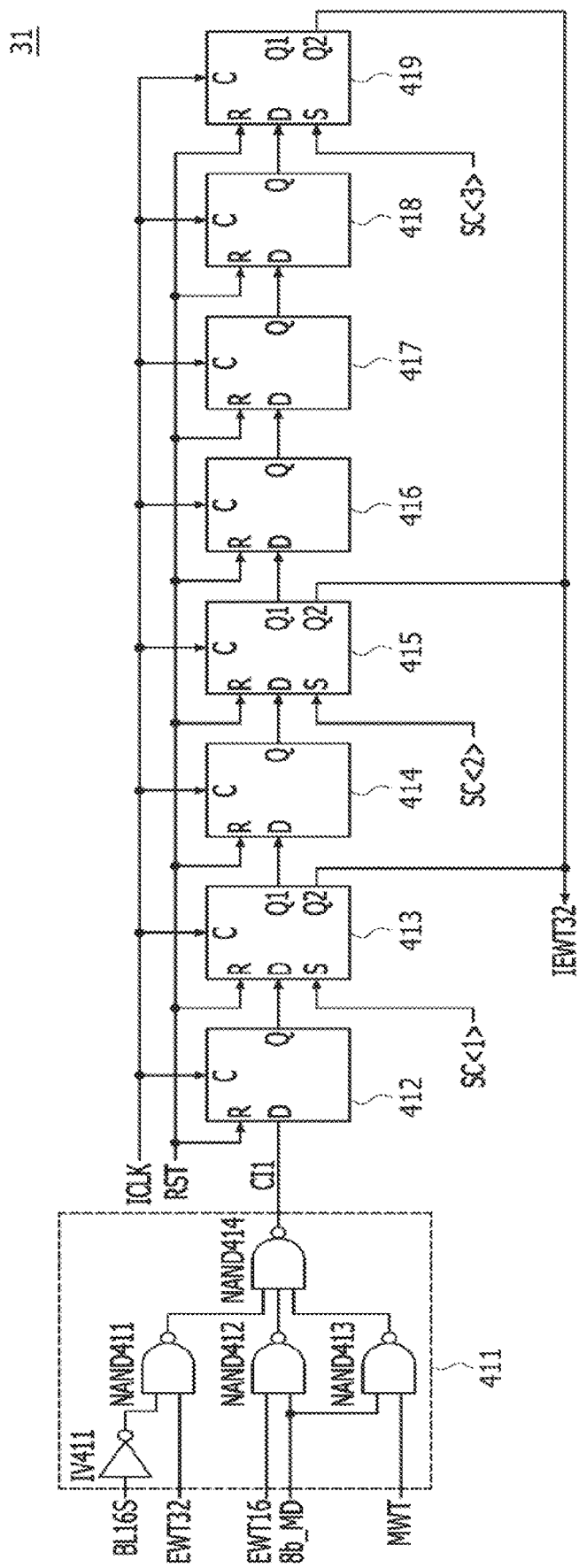
FIG. 4 shows a circuit diagram illustrating an example of a write drive signal generation circuit included in the burst mode signal generation circuit of FIG. 3.

Referring to FIG. 4, the write drive signal generation circuit 31 may include a write input signal generation circuit 411, a first write input signal latch 412, a second write input signal latch 413, a third write input signal latch 414, a fourth write input signal latch 415, a fifth write input signal latch 416, a sixth write input signal latch 417, a seventh write input signal latch 418, and an eighth write input signal latch 419. Each of the first write input signal latch 412, the second write input signal latch 413, the third write input signal latch 414, the fourth write input signal latch 415, the fifth write input signal latch 416, the sixth write input signal latch 417, the seventh write input signal latch 418, and the eighth write input signal latch 419 may be realized using a D-flip flop.

The write input signal generation circuit 411 may include an inverter IV411 and NAND gates NAND411, NAND412, NAND413, and NAND414. The inverter IV411 may inversely buffer the burst mode signal BL16S to output the inversely buffered signal of the burst mode signal BL16S. The NAND gate NAND411 may receive an output signal of the inverter IV411 and the second write signal EWT32 to perform a logical NAND operation of the output signal of the inverter IV411 and the second write signal EWT32. The NAND gate NAND412 may receive the first write signal EWT16 and the mode information signal 8b_MD to perform a logical NAND operation of the first write signal EWT16 and the mode information signal 8b_MD. The NAND gate NAND413 may receive the mask write signal MWT and the mode information signal 8b_MD to perform a logical NAND operation of the mask write signal MWT and the mode information signal 8b_MD. The NAND gate NAND414 may perform a logical NAND operation of output signals of the NAND gates NAND411, NAND412, and NAND13 to generate a write input signal CI1.

The write input signal generation circuit 411 may generate the write input signal CI1 which is set to have a logic "high" level if the burst mode signal BL16S is set to have a logic "low" level by the write operation performed while the burst length is set to be "32" and the second write signal EWT32 is generated to have a logic "high" level. The write input signal generation circuit 411 may generate the write input signal CI1 which is set to have a logic "high" level if the mode information signal 8b_MD is set to have a logic "high" level by the write operation performed while the burst length is set to be "16" in the 8-bank mode and the first write signal EWT16 is generated to have a logic "high" level. The write input signal generation circuit 411 may generate the write input signal CI1 which is set to have a logic "high" level if the mode information signal 8b_MD is set to have a logic "high" level by the mask write operation performed while the burst length is set to be "16" in the 8-bank mode and the mask write signal MWT is generated to have a logic "high" level.

The first write input signal latch 412 may receive a reset signal RST through a reset input terminal R thereof and may receive the internal clock signal ICLK through a clock input terminal C thereof. The first write input signal latch 412 may initialize an output terminal Q thereof to a logic "low" level if the reset signal RST is generated. The first write input signal latch 412 may shift the write input signal CI1 inputted to an input terminal D thereof by one cycle of the internal clock signal ICLK to output the shifted signal of the write input signal CI1 through the output terminal Q. A configuration and an operation of the first write input signal latch 412 are described more fully below with reference to FIG. 5.

The second write input signal latch 413 may receive the reset signal RST through a reset input terminal R thereof, may receive the internal clock signal ICLK through a clock input terminal C thereof, and may receive the first shift control signal SC<1> through a selection input terminal S thereof. The second write input signal latch 413 may initialize both of a first output terminal Q1 and a second output terminal Q2 thereof to a logic "low" level if the reset signal RST is generated. The second write input signal latch 413 may receive an output signal outputted from the output terminal Q of the first write input signal latch 412 through an input terminal D thereof and may shift the output signal of the first write input signal latch 412 by one cycle of the internal clock signal ICLK to output the shifted signal of the output signal of the first write input signal latch 412 through the first output terminal Q1. The second write input signal latch 413 may output a signal of the first output terminal Q1 as the write drive signal IEWT32 through the second output terminal Q2 if the first shift control signal SC<1> is generated. A configuration and an operation of the second write input signal latch 413 are described more fully below with reference to FIG. 6. 413 are described more fully below with reference to FIG. 6r.

The third write input signal latch 414 may receive the reset signal RST through a reset input terminal R thereof and may receive the internal clock signal ICLK through a clock input terminal C thereof. The third write input signal latch 414 may initialize an output terminal Q thereof to a logic "low" level if the reset signal RST is generated. The third write input signal latch 414 may receive a first output signal outputted from the first output terminal Q1 of the second write input signal latch 413 through an input terminal D thereof and may shift the first output signal of the second write input signal latch 413 by one cycle of the internal clock signal ICLK to output the shifted signal of the first output signal of the second write input signal latch 413 through the output terminal Q thereof.

The fourth write input signal latch 415 may receive the reset signal RST through a reset input terminal R thereof, may receive the internal clock signal ICLK through a clock input terminal C thereof, and may receive the second shift control signal SC<2> through a selection input terminal S thereof. The fourth write input signal latch 415 may initialize both of a first output terminal Q1 and a second output terminal Q2 thereof to a logic "low" level if the reset signal RST is generated. The fourth write input signal latch 415 may receive an output signal outputted from the output terminal Q of the third write input signal latch 414 through an input terminal D thereof and may shift the output signal of the third write input signal latch 414 by one cycle of the internal dock signal ICLK to output the shifted signal of the output signal of the third write input signal latch 414 through the first output terminal Q1. The fourth write input signal latch 415 may output a signal of the first output terminal Q1 as the write drive signal IEWT32 through the second output terminal Q2 if the second shift control signal SC<2> is generated.

The fifth write input signal latch 416 may receive the reset signal RST through a reset input terminal R thereof and may receive the internal clock signal ICLK through a clock input terminal C thereof. The fifth write input signal latch 416 may initialize an output terminal Q thereof to a logic "low" level if the reset signal RST is generated. The fifth write input signal latch 416 may receive a first output signal outputted from the first output terminal Q1 of the fourth write input signal latch 415 through an input terminal D thereof and may shift the first output signal of the fourth write input signal latch 415 by one cycle of the internal clock signal ICLK to output the shifted signal of the first output signal of the fourth write input signal latch 415 through the output terminal Q thereof.

The sixth write input signal latch 417 may receive the reset signal RST through a reset input terminal R thereof and may receive the internal clock signal ICLK through a clock input terminal C thereof. The sixth write input signal latch 417 may initialize an output terminal Q thereof to a logic "low" level if the reset signal RST is generated. The sixth write input signal latch 417 may receive an output signal outputted from the output terminal Q of the fifth write input signal latch 416 through an input terminal D thereof and may shift the output signal of the fifth write input signal latch 416 by one cycle of the internal clock signal ICLK to output the shifted signal of the output signal of the fifth write input signal latch 416 through the output terminal Q thereof.

The seventh write input signal latch 418 may receive the reset signal RST through a reset input terminal R thereof and may receive the internal clock signal ICLK through a clock input terminal C thereof. The seventh write input signal latch 418 may initialize an output terminal Q thereof to a logic "low" level if the reset signal RST is generated. The seventh write input signal latch 418 may receive an output signal outputted from the output terminal Q of the sixth write input signal latch 417 through an input terminal D thereof and may shift the output signal of the sixth write input signal latch 417 by one cycle of the internal clock signal ICLK to output the shifted signal of the output signal of the sixth write input signal latch 417 through the output terminal Q thereof.

The eighth write input signal latch 419 may receive the reset signal RST through a reset input terminal R thereof, may receive the internal clock signal ICLK through a clock input terminal C thereof, and may receive the third shift control signal SC<3> through a selection input terminal S thereof. The eighth write input signal latch 419 may initialize both of a first output terminal Q1 and a second output terminal Q2 thereof to a logic "low" level if the reset signal RST is generated. The eighth write input signal latch 419 may receive an output signal outputted from the output terminal Q of the seventh write input signal latch 418 through an input terminal D thereof and may shift the output signal of the seventh write input signal latch 418 by one cycle of the internal clock signal ICLK to output the shifted signal of the output signal of the seventh write input signal latch 418 through the first output terminal Q1. The eighth write input signal latch 419 may output a signal of the first output terminal Q1 as the write drive signal IEWT32 through the second output terminal Q2 if the third shift control signal SC<3> is generated.

Figure 5:
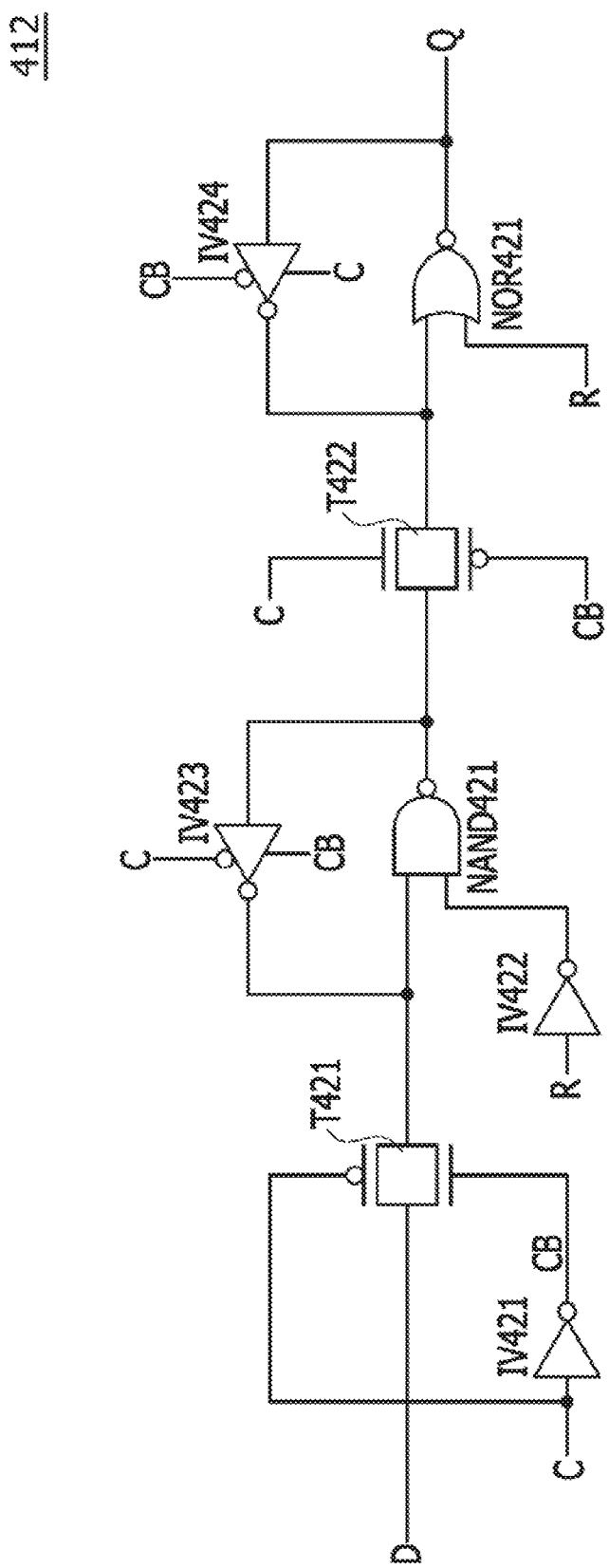
FIG. 5 shows a circuit diagram illustrating an example of a first write input signal latch included in the write drive signal generation circuit of FIG. 4.

Referring to FIG. 5, the first write input signal latch 412 may include an inverter IV421, a transfer gate T421, an inverter IV422, a NAND gate NAND421, an inverter IV423, a transfer gate T422, a NOR gate NOR421, and an inverter IV424. The inverter IV421 may inversely buffer a signal of the clock input terminal C to generate an inverted clock signal CB. The transfer gate T421 may be turned on to output the write input signal CI1 inputted through the input terminal D to a first input terminal of the NAND gate NAND421, if a signal of the clock input terminal C has a logic "low" level. The inverter IV422 may inversely buffer a signal inputted through the reset input terminal R to output the inversely buffered signal of the signal of the reset input terminal R to a second input terminal of the NAND gate NAND421. The NAND gate NAND421 may perform a logical NAND operation of an output signal of the transfer gate T421 and an output signal of the inverter IV422 to output the result of the logical NAND operation. The inverter IV423 may inversely buffer the output signal of the NAND gate NAND421 to output the inversely buffered signal of the output signal of the NAND gate NAND421 to the first input terminal of the NAND gate NAND421 if a signal of the clock input terminal C has a logic "low" level. The transfer gate T422 may be turned on to output an output signal of the NAND gate NAND421 to a first input terminal of the NOR gate NOR421 if a signal of the clock input terminal C has a logic "high" level. The NOR gate NOR421 may perform a logical NOR operation of an output signal of the transfer gate T422 and a signal of the reset input terminal R to output a result of the logical NOR operation to the output terminal Q. The inverter IV424 may inversely buffer a signal of the output terminal Q to output the inversely buffered signal of the signal of the output terminal Q to the first input terminal of the NOR gate NOR421 if a signal of the clock input terminal C has a logic "high" level. The first write input signal latch 412 may initialize the output terminal Q thereof to a logic "low" level if the reset signal RST is generated. The first write input signal latch 412 may shift the write input signal CI1 inputted through the input terminal D by one cycle of the internal clock signal ICLK to output the shifted signal of the write input signal CI1 to the output terminal Q of the first write input signal latch 412. Each of the third, fifth, sixth and seventh write input signal latches 414, 416, 417, and 418 illustrated in FIG. 4 may be realized using the same circuit as the first write input signal latch 412 illustrated in FIG. 5.

Figure 6:
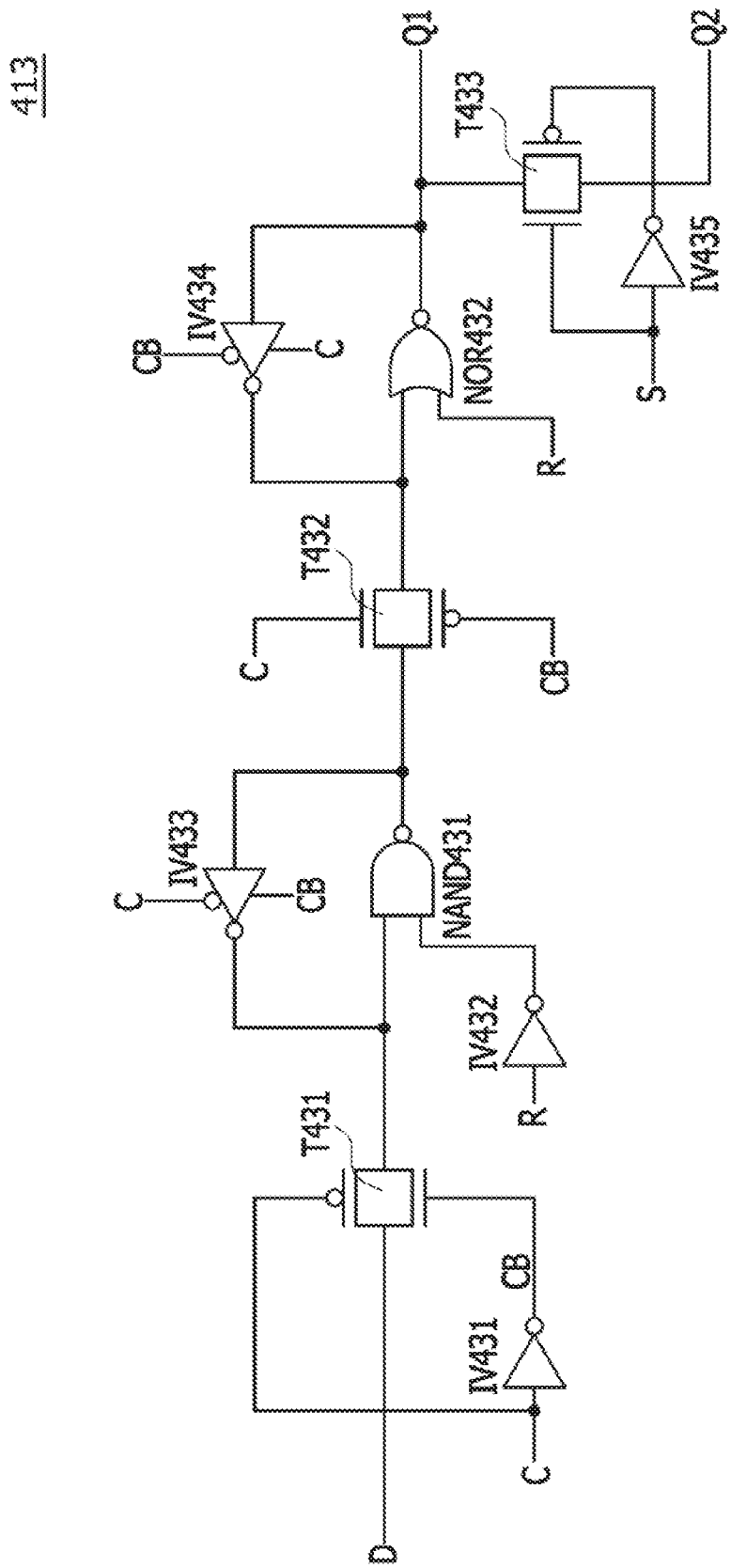
FIG. 6 shows a circuit diagram illustrating an example of a second write input signal latch included in the write drive signal generation circuit of FIG. 4.

Referring to FIG. 6, the second write input signal latch 413 may include an inverter IV431, a transfer gate T431, an inverter IV432, a NAND gate NAND431, an inverter IV433, a transfer gate T432, a NOR gate NOR432, an inverter IV434, an inverter IV435, and a transfer gate T433. The inverter IV431 may inversely buffer a signal of the clock input terminal C to generate an inverted clock signal CB. The transfer gate T431 may be turned on to output a signal inputted through the input terminal D to a first input terminal of the NAND gate NAND431, if a signal of the clock input terminal C has a logic "low" level. The inverter IV432 may inversely buffer a signal inputted through the reset input terminal R to output the inversely buffered signal of the signal of the reset input terminal R to a second input terminal of the NAND gate NAND431. The NAND gate NAND431 may perform a logical NAND operation of an output signal of the transfer gate T431 and an output signal of the inverter IV432 to output the result of the logical NAND operation. The inverter IV433 may inversely buffer the output signal of the NAND gate NAND431 to output the inversely buffered signal of the output signal of the NAND gate NAND431 to the first input terminal of the NAND gate NAND431 if a signal of the clock input terminal C has a logic "low" level. The transfer gate T432 may be turned on to output an output signal of the NAND gate NAND431 to a first input terminal of the NOR gate NOR432 if a signal of the clock input terminal C has a logic "high" level. The NOR gate NOR432 may perform a logical NOR operation of an output signal of the transfer gate T432 and a signal of the reset input terminal R to output a result of the logical NOR operation to the first output terminal Q1. The inverter IV434 may inversely buffer a signal of the first output terminal Q1 to output the inversely buffered signal of the signal of the first output terminal Q1 to the first input terminal of the NOR gate NOR432 if a signal of the clock input terminal C has a logic "high" level. The inverter IV435 may inversely buffer the first shift control signal SC<1> inputted through the selection input terminal S to output the inversely buffered signal of the first shift control signal SC<1> as an output signal. The transfer gate T433 may be turned on to output a signal of the first output terminal Q1 through the second output terminal Q2 if the first control signal SC<1> is generated. The second write input signal latch 413 may initialize the first output terminal Q1 thereof to a logic "low" level if the reset signal RST is generated. The second write input signal latch 413 may shift an output signal of the first write input signal latch 412 inputted through the input terminal D by one cycle of the internal clock signal ICLK to output the shifted signal of the output signal of the first write input signal latch 412 to the first output terminal Q1 of the second write input signal latch 413. The second write input signal latch 413 may output a signal of the first output terminal Q1 through the second output terminal Q2 if the first shift control signal is generated. Each of the fourth and eighth write input signal latches 415 and 419 illustrated in FIG. 4 may be realized using the same circuit as the second write input signal latch 413 illustrated in FIG. 6.

Figure 7:
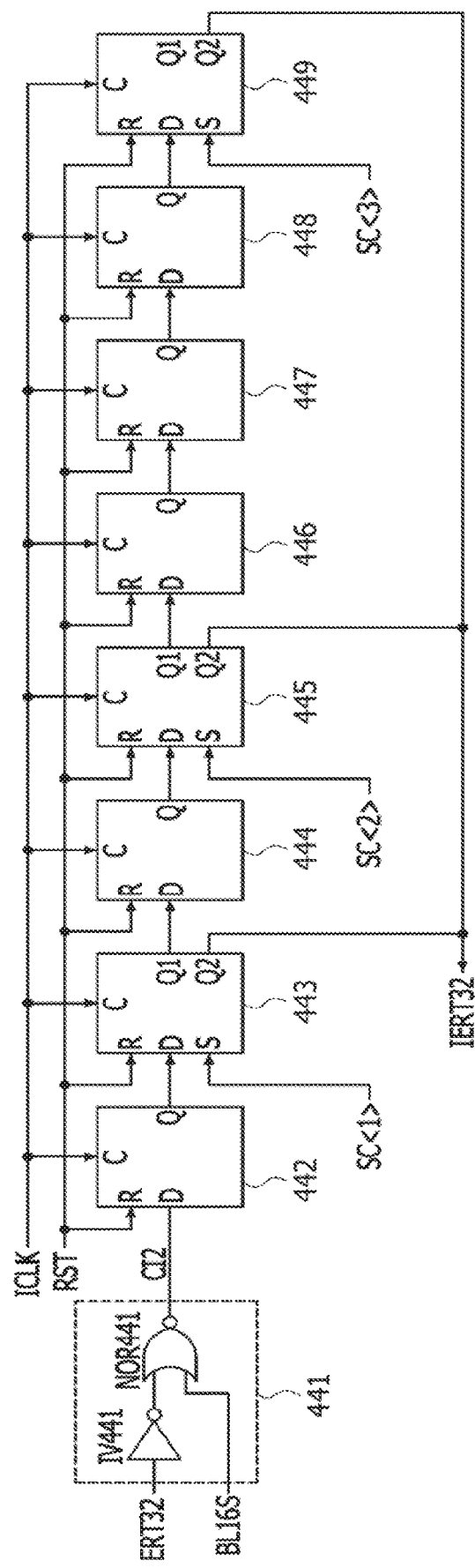
FIG. 7 shows a circuit diagram illustrating an example of a read drive signal generation circuit included in the burst mode signal generation circuit of FIG. 3.

Referring to FIG. 7, the read drive signal generation circuit 32 may include a read input signal generation circuit 441, a first read input signal latch 442, a second read input signal latch 443, a third read input signal latch 444, a fourth read input signal latch 445, a fifth read input signal latch 446, a sixth read input signal latch 447, a seventh read input signal latch 448, and an eighth read input signal latch 449. Each of the first read input signal latch 442, the second read input signal latch 443, the third read input signal latch 444, the fourth read input signal latch 445, the fifth read input signal latch 446, the sixth read input signal latch 447, the seventh read input signal latch 448, and the eighth read input signal latch 449 may be realized using a D-flip flop.

The read input signal generation circuit 441 may include an inverter IV441 and a NOR gate NOR441. The inverter IV441 may inversely buffer the second read signal ERT32 to output the inversely buffered signal of the second read signal ERT32. The NOR gate NOR441 may perform a logical NOR operation of an output signal of the inverter IV441 and the burst mode signal BL16S to generate a read input signal Cl2. The read input signal generation circuit 441 may generate the read input signal C12 which is set to have a logic "high" level if the burst mode signal BL16S is set to have a logic "low" level by the read operation performed while the burst length is set to be "32" and the second read signal ERT32 is generated to have a logic "high" level.

The first read input signal latch 442 may receive the reset signal RST through a reset input terminal R thereof and may receive the internal clock signal ICLK through a clock input terminal C thereof. The first read input signal latch 442 may initialize an output terminal Q thereof to a logic "low" level if the reset signal RST is generated. The first read input signal latch 442 may shift the read input signal C12 inputted to an input terminal D thereof by one cycle of the internal clock signal ICLK to output the shifted signal of the read input signal C12 through the output terminal Q.

The second read input signal latch 443 may receive the reset signal RST through a reset input terminal R thereof, may receive the internal clock signal ICLK through a clock input terminal C thereof, and may receive the first shift control signal SC<1> through a selection input terminal S thereof. The second read input signal latch 443 may initialize both of a first output terminal Q1 and a second output terminal Q2 thereof to a logic "low" level if the reset signal RST is generated. The second read input signal latch 443 may receive an output signal outputted from the output terminal Q of the first read input signal latch 442 through an input terminal D thereof and may shift the output signal of the first read input signal latch 442 by one cycle of the internal clock signal ICLK to output the shifted signal of the output signal of the first read input signal latch 442 through the first output terminal Q1. The second read input signal latch 443 may output a signal of the first output terminal Q1 as the read drive signal IERT32 through the second output terminal Q2 if the first shift control signal SC<1> is generated.

The third read input signal latch 444 may receive the reset signal RST through a reset input terminal R thereof and may receive the internal clock signal ICLK through a clock input terminal C thereof. The third read input signal latch 444 may initialize an output terminal Q thereof to a logic "low" level if the reset signal RST is generated. The third read input signal latch 444 may receive a first output signal outputted from the first output terminal Q1 of the second read input signal latch 443 through an input terminal D thereof and may shift the first output signal of the second read input signal latch 443 by one cycle of the internal clock signal ICLK to output the shifted signal of the first output signal of the second read input signal latch 443 through the output terminal Q thereof.

The fourth read input signal latch 445 may receive the reset signal RST through a reset input terminal R thereof, may receive the internal clock signal ICLK through a clock input terminal C thereof, and may receive the second shift control signal SC<2> through a selection input terminal S thereof. The fourth read input signal latch 445 may initialize both of a first output terminal Q1 and a second output terminal Q2 thereof to a logic "low" level if the reset signal RST is generated. The fourth read input signal latch 445 may receive an output signal outputted from the output terminal Q of the third read input signal latch 444 through an input terminal D thereof and may shift the output signal of the third read input signal latch 444 by one cycle of the internal clock signal ICLK to output the shifted signal of the output signal of the third read input signal latch 444 through the first output terminal Q1. The fourth read input signal latch 445 may output a signal of the first output terminal Q1 as the read drive signal IERT32 through the second output terminal Q2 if the second shift control signal SC<2> is generated.

The fifth read input signal latch 446 may receive the reset signal RST through a reset input terminal R thereof and may receive the internal clock signal ICLK through a clock input terminal C thereof. The fifth read input signal latch 446 may initialize an output terminal Q thereof to a logic "low" level if the reset signal RST is generated. The fifth read input signal latch 446 may receive a first output signal outputted from the first output terminal Q1 of the fourth read input signal latch 445 through an input terminal D thereof and may shift the first output signal of the fourth read input signal latch 445 by one cycle of the internal clock signal ICLK to output the shifted signal of the first output signal of the fourth read input signal latch 445 through the output terminal Q thereof.

The sixth read input signal latch 447 may receive the reset signal RST through a reset input terminal R thereof and may receive the internal clock signal ICLK through a clock input terminal C thereof. The sixth read input signal latch 447 may initialize an output terminal Q thereof to a logic "low" level if the reset signal RST is generated. The sixth read input signal latch 447 may receive an output signal outputted from the output terminal Q of the fifth read input signal latch 446 through an input terminal D thereof and may shift the output signal of the fifth read input signal latch 446 by one cycle of the internal clock signal ICLK to output the shifted signal of the output signal of the fifth read input signal latch 446 through the output terminal Q thereof.

The seventh read input signal latch 448 may receive the reset signal RST through a reset input terminal R thereof and may receive the internal clock signal ICLK through a clock input terminal C thereof. The seventh read input signal latch 448 may initialize an output terminal Q thereof to a logic "low" level if the reset signal RST is generated. The seventh read input signal latch 448 may receive an output signal outputted from the output terminal Q of the sixth read input signal latch 447 through an input terminal D thereof and may shift the output signal of the sixth read input signal latch 447 by one cycle of the internal clock signal ICLK to output the shifted signal of the output signal of the sixth read input signal latch 447 through the output terminal Q thereof.

The eighth read input signal latch 449 may receive the reset signal RST through a reset input terminal R thereof, may receive the internal clock signal ICLK through a clock input terminal C thereof, and may receive the third shift control signal SC<3> through a selection input terminal S thereof. The eighth read input signal latch 449 may initialize both of a first output terminal Q1 and a second output terminal Q2 thereof to a logic "low" level if the reset signal RST is generated. The eighth read input signal latch 449 may receive an output signal outputted from the output terminal Q of the seventh read input signal latch 448 through an input terminal D thereof and may shift the output signal of the seventh read input signal latch 448 by one cycle of the internal clock signal ICLK to output the shifted signal of the output signal of the seventh read input signal latch 448 through the first output terminal Q1. The eighth read input signal latch 449 may output a signal of the first output terminal Q1 as the read drive signal IERT32 through the second output terminal Q2 if the third shift control signal SC<3> is generated.

Figure 8:
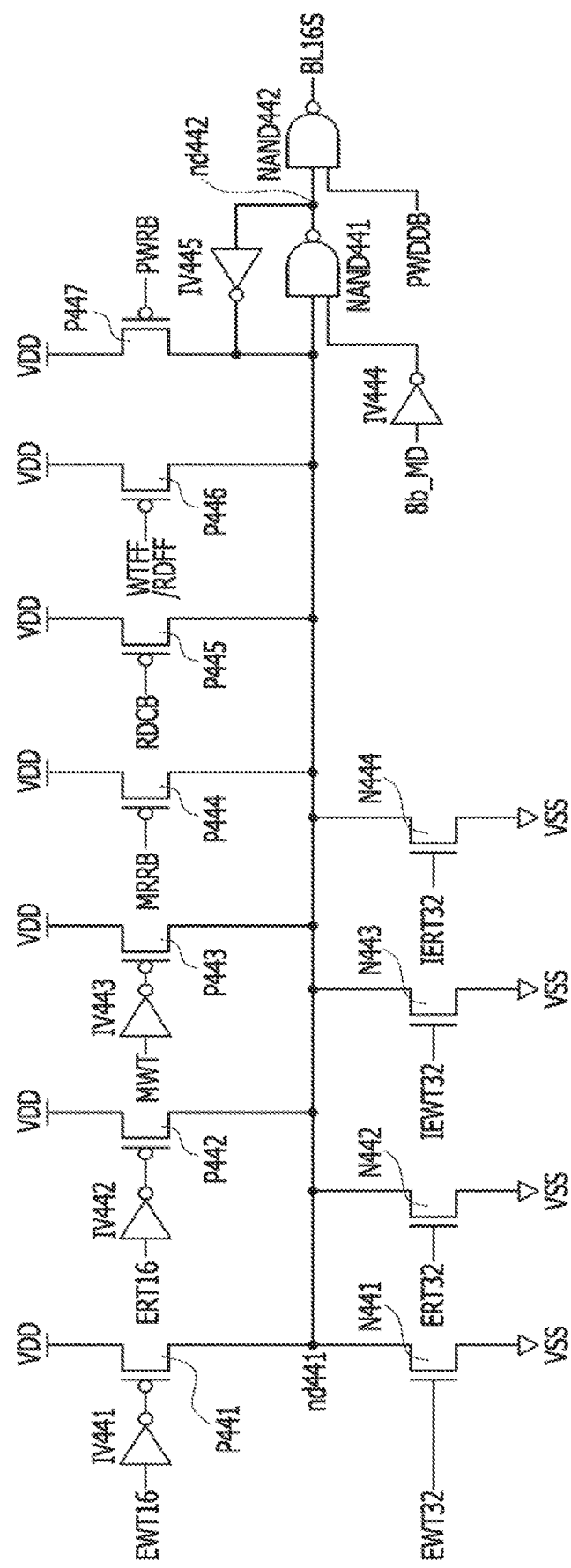
FIG. 8 shows a circuit diagram illustrating an example of a burst mode signal drive circuit included in the burst mode signal generation circuit of FIG. 3.

Referring to FIG. 8, the burst mode signal drive circuit 33 may include inverters IV441~IV445, PMOS transistors P441~P447, NMOS transistors N441~N444 and NAND gates NAND441 and NAND442. As used herein, the tilde "~" indicates a range of components. For example, "IV441~IV445" indicates the inverters IV441, IV442, IV443, IV444, and IV445 shown in FIG. 8.

The inverter IV441 may inversely buffer the first write signal EWT16 to output the inversely buffered signal of the first write signal EWT16. The PMOS transistor P441 may drive a node nd441 to a power supply voltage VDD in response to an output signal of the inverter IV441 which is generated to have a logic "low" level. The inverter IV442 may inversely buffer the first read signal ERT16 to output the inversely buffered signal of the first read signal ERT16. The PMOS transistor P442 may drive the node nd441 to the power supply voltage VDD in response to an output signal of the inverter IV442 which is generated to have a logic "low" level. The inverter IV443 may inversely buffer the mask write signal MWT to output the inversely buffered signal of the mask write signal MWT. The PMOS transistor P443 may drive the node nd441 to the power supply voltage VDD in response to an output signal of the inverter IV443 which is generated to have a logic "low" level. The PMOS transistor P444 may drive the node nd441 to the power supply voltage VDD in response to the mode register read signal MRRB which is generated to have a logic "low" level. The PMOS transistor P445 may drive the node nd441 to the power supply voltage VDD in response to the read data control signal RDCB which is generated to have a logic "low" level. The PMOS transistor P446 may drive the node nd441 to the power supply voltage VDD in response to the test write/read signal WTFF/RDFF which is generated to have a logic "low" level. The PMOS transistor P447 may drive the node nd441 to the power supply voltage VDD in response to a power-up signal PWRB. The power-up signal PWRB may be set to have a logic "low" level during a power-up period that the power supply voltage VDD increases to reach a predetermined level at an initial operation step of the semiconductor device 10.

The NMOS transistor N441 may drive the node nd441 to a ground voltage VSS in response to the second write signal EWT32. The NMOS transistor N442 may drive the node nd441 to the ground voltage VSS in response to the second read signal ERT32. The NMOS transistor N443 may drive the node nd441 to the ground voltage VSS in response to the write drive signal IEWT32. The NMOS transistor N444 may drive the node nd441 to the ground voltage VSS in response to the read drive signal IERT32. The inverter IV444 may inversely buffer the mode information signal 8b_MD to output the inversely buffered signal of the mode information signal 8b_MD. The NAND gate NAND441 may receive a signal of the node nd441 and an output signal of the inverter IV444 and may perform a logical NAND operation of the signal of the node nd441 and the output signal of the inverter IV444 to output the result of the logical NAND operation to a node nd442. The inverter IV445 may inversely buffer a signal of the node nd442 to output the inversely buffered signal of the signal of the node nd442 to the node nd441. The NAND gate NAND442 may perform a logical NAND operation of a signal of the node nd442 and a power-down signal PWDDB to generate the burst mode signal BL16S. The power-down signal PWDDB may be set to have a logic "low" level in a power-down mode.

The burst mode signal generation circuit 103 may generate the burst mode signal BL16S which is set to have a logic "high" level by the power-up signal PWRB which is set to have a logic "low" level during the power-up period. The burst mode signal generation circuit 103 may generate the burst mode signal BL16S which is set to have a logic "high" level by the power-down signal PWDDB which is set to have a logic "low" level in the power-down mode. The burst mode signal generation circuit 103 may generate the burst mode signal BL16S which is set to have a logic "high" level if the write operation or the read operation is performed while the burst length is set to be "16." The burst mode signal generation circuit 103 may generate the burst mode signal BL16S which is set to have a logic "high" level if the write operation or the read operation for input or output of information on a test operation is performed while the burst length is set to be "16." The burst mode signal generation circuit 103 may generate the burst mode signal BL16S which is set to have a logic "high" level if the mask write operation or the mode register read operation is performed while the burst length is set to be "16." The burst mode signal generation circuit 103 may generate the burst mode signal BL16S which is set to have a logic "high" level if the read data calibration operation is performed while the burst length is set to be "16." The burst mode signal generation circuit 103 may generate the burst mode signal BL16S which is set to have a logic "low" level if the write operation or the read operation is performed while the burst length is set to be "32." The burst mode signal generation circuit 103 may generate the burst mode signal BL16S which is set to have a logic "low" level if the write operation or the read operation is performed in the 8-bank mode.

Figure 9:
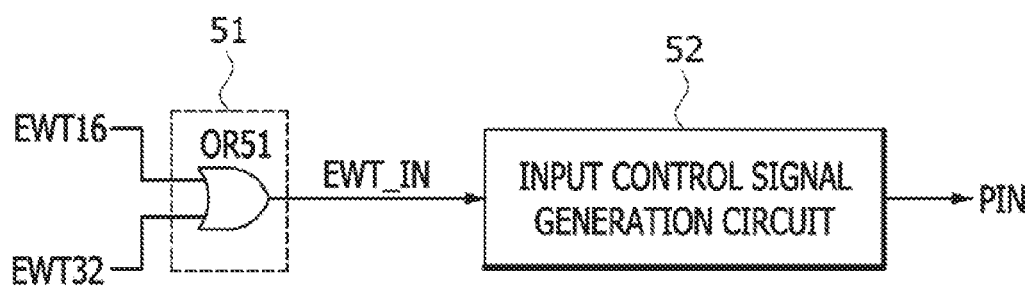
FIG. 9 illustrates an example of an input control circuit included in the semiconductor device of FIG. 1.

Referring to FIG. 9, the input control circuit 104 may include a synthesized input signal generation circuit 51 and an input control signal generation circuit 52. The synthesized input signal generation circuit 51 may include an OR gate OR51. The OR gate OR51 may perform a logical OR operation of the first write signal EWT16 and the second write signal EWT32 to generate a synthesized input signal EWT_IN. The synthesized input signal generation circuit 51 may generate the synthesized input signal EWT_IN if the first write signal EWT16 or the second write signal EWT32 is generated. The input control signal generation circuit 52 may generate the input control signal PIN if the synthesized input signal EWT_IN is generated.

Figure 10:
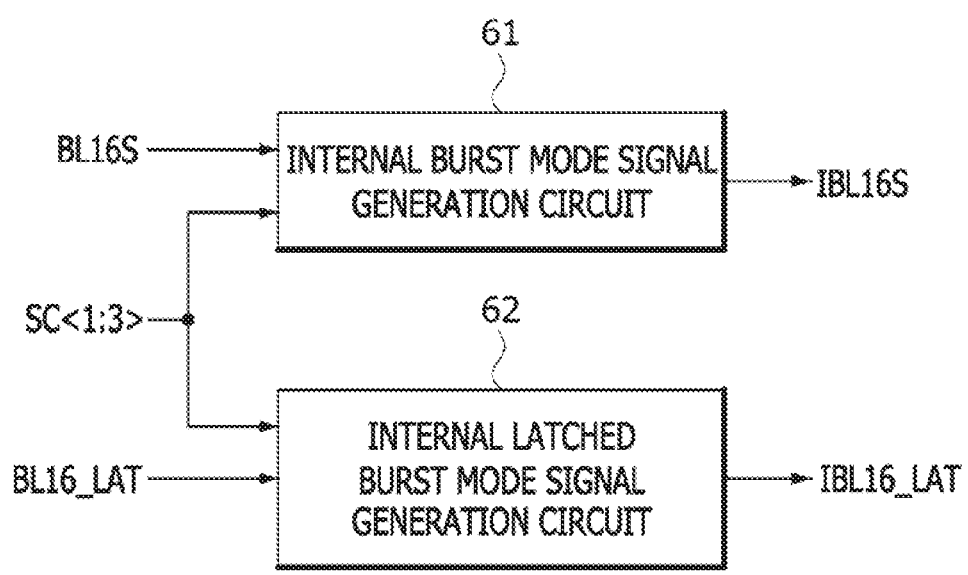
FIG. 10 shows a block diagram illustrating an example of a burst mode signal shift circuit included in the semiconductor device of FIG. 1.

Referring to FIG. 10, the burst mode signal shift circuit 107 may include an internal burst mode signal generation circuit 61 and an internal latched burst mode signal generation circuit 62. The internal burst mode signal generation circuit 61 may shift the burst mode signal BL16S by a period determined based on the first to third shift control signals SC<1:3> to generate the internal burst mode signal IBL16S. For example, the internal burst mode signal generation circuit 61 may shift the burst mode signal BL16S by two cycles of the internal clock signal ICLK to generate the internal burst mode signal IBL16S if the first shift control signal SC<1> is generated, may shift the burst mode signal BL16S by four cycles of the internal clock signal ICLK to generate the internal burst mode signal IBL16S if the second shift control signal SC<2> is generated, and may shift the burst mode signal BL16S by eight cycles of the internal clock signal ICLK to generate the internal burst mode signal IBL16S if the third shift control signal SC<3> is generated.

The internal latched burst mode signal generation circuit 62 may shift the latched burst mode signal BL16_LAT by a period determined based on the first to third shift control signals SC<1:3> to generate the internal latched burst mode signal IBL16_LAT. For example, the internal latched burst mode signal generation circuit 62 may shift the latched burst mode signal BL16_LAT by two cycles of the internal clock signal ICLK to generate the internal latched burst mode signal IBL16_LAT if the first shift control signal SC<1> is generated, may shift the latched burst mode signal BL16_LAT by four cycles of the internal clock signal ICLK to generate the internal latched burst mode signal IBL16_LAT if the second shift control signal SC<2> is generated, and may shift the latched burst mode signal BL16_LAT by eight cycles of the internal clock signal ICLK to generate the internal latched burst mode signal IBL16_LAT if the third shift control signal SC<3> is generated.

Figure 11:
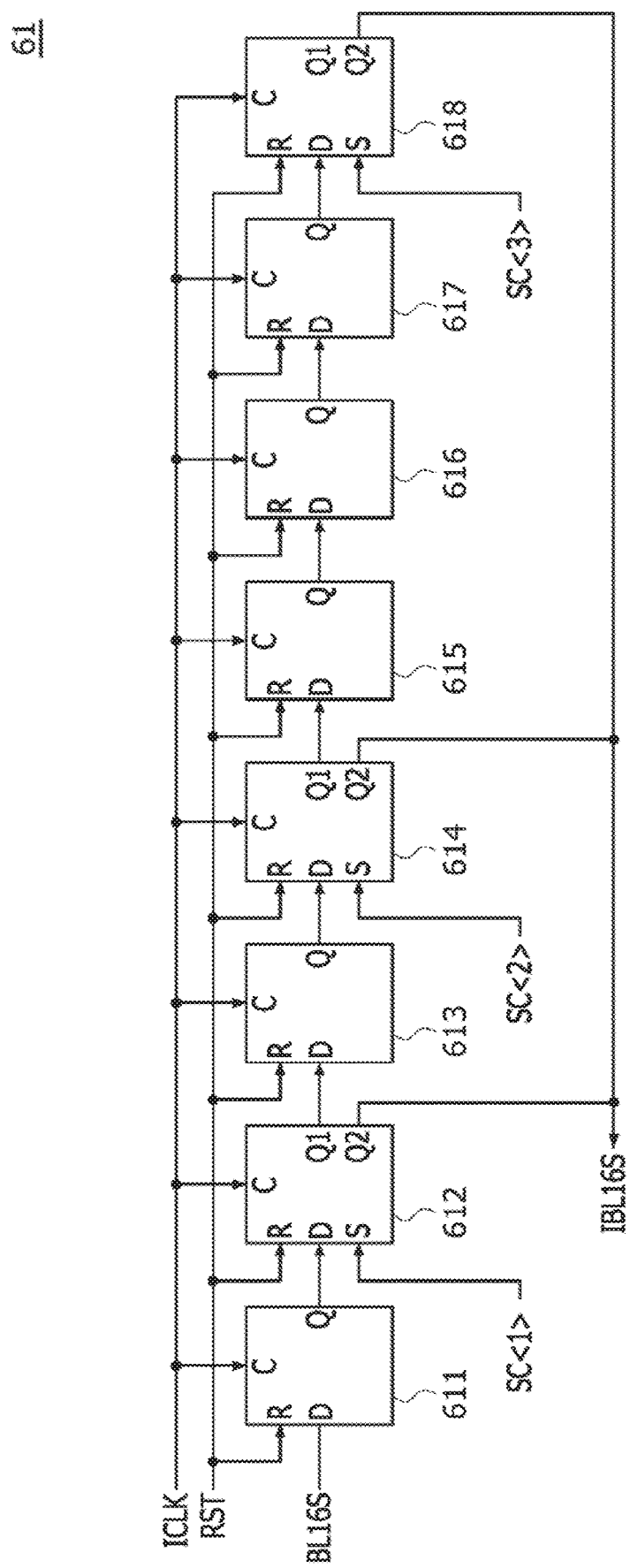
FIG. 11 shows a circuit diagram illustrating an example of an internal burst mode signal generation circuit included in the burst mode signal shift circuit of FIG. 10.

Referring to FIG. 11, the internal burst mode signal generation circuit 61 may include a first burst latch 611, a second burst latch 612, a third burst latch 613, a fourth burst latch 614, a fifth burst latch 615, a sixth burst latch 616, a seventh burst latch 617, and an eighth burst latch 618. Each of the first burst latch 611, the second burst latch 612, the third burst latch 613, the fourth burst latch 614, the fifth burst latch 615, the sixth burst latch 616, the seventh burst latch 617, and the eighth burst latch 618 may be realized using a D-flip flop.

The first burst latch 611 may receive the reset signal RST through a reset input terminal R thereof and may receive the internal clock signal ICLK through a clock input terminal C thereof. The first burst latch 611 may initialize an output terminal Q thereof to a logic "low" level if the reset signal RST is generated. The first burst latch 611 may shift the burst mode signal BL16S inputted to an input terminal D thereof by one cycle of the internal clock signal ICLK to output the shifted signal of the burst mode signal BL16S through the output terminal Q.

The second burst latch 612 may receive the reset signal RST through a reset input terminal R thereof, may receive the internal clock signal ICLK through a clock input terminal C thereof, and may receive the first shift control signal SC<1> through a selection input terminal S thereof. The second burst latch 612 may initialize both of a first output terminal Q1 and a second output terminal Q2 thereof to a logic "low" level if the reset signal RST is generated. The second burst latch 612 may receive an output signal outputted from the output terminal Q of the first burst latch 611 through an input terminal D thereof and may shift the output signal of the first burst latch 611 by one cycle of the internal clock signal ICLK to output the shifted signal of the output signal of the first burst latch 611 through the first output terminal Q1. The second burst latch 612 may output a signal of the first output terminal Q1 as the internal burst mode signal IBL16S through the second output terminal Q2 if the first shift control signal SC<1> is generated.

The third burst latch 613 may receive the reset signal RST through a reset input terminal R thereof and may receive the internal clock signal ICLK through a clock input terminal C thereof. The third burst latch 613 may initialize an output terminal Q thereof to a logic "low" level if the reset signal RST is generated. The third burst latch 613 may receive a first output signal outputted from the first output terminal Q1 of the second burst latch 612 through an input terminal D thereof and may shift the first output signal of the second burst latch 612 by one cycle of the internal clock signal ICLK to output the shifted signal of the first output signal of the second burst latch 612 through the output terminal Q thereof.

The fourth burst latch 614 may receive the reset signal RST through a reset input terminal R thereof, may receive the internal clock signal ICLK through a clock input terminal C thereof, and may receive the second shift control signal SC<2> through a selection input terminal S thereof. The fourth burst latch 614 may initialize both of a first output terminal Q1 and a second output terminal Q2 thereof to a logic "low" level if the reset signal RST is generated. The fourth burst latch 614 may receive an output signal outputted from the output terminal Q of the third burst latch 613 through an input terminal D thereof and may shift the output signal of the third burst latch 613 by one cycle of the internal clock signal ICLK to output the shifted signal of the output signal of the third burst latch 613 through the first output terminal Q1. The fourth burst latch 614 may output a signal of the first output terminal Q1 as the internal burst mode signal IBL16S through the second output terminal Q2 if the second shift control signal SC<2> is generated.

The fifth burst latch 615 may receive the reset signal RST through a reset input terminal R thereof and may receive the internal clock signal ICLK through a clock input terminal C thereof. The fifth burst latch 615 may initialize an output terminal Q thereof to a logic "low" level if the reset signal RST is generated. The fifth burst latch 615 may receive a first output signal outputted from the first output terminal Q1 of the fourth burst latch 614 through an input terminal D thereof and may shift the first output signal of the fourth burst latch 614 by one cycle of the internal clock signal ICLK to output the shifted signal of the first output signal of the fourth burst latch 614 through the output terminal Q thereof.

The sixth burst latch 616 may receive the reset signal RST through a reset input terminal R thereof and may receive the internal clock signal ICLK through a clock input terminal C thereof. The sixth burst latch 616 may initialize an output terminal Q thereof to a logic "low" level if the reset signal RST is generated. The sixth burst latch 616 may receive an output signal outputted from the output terminal Q of the fifth burst latch 615 through an input terminal D thereof and may shift the output signal of the fifth burst latch 615 by one cycle of the internal clock signal ICLK to output the shifted signal of the output signal of the fifth burst latch 615 through the output terminal Q thereof.

The seventh burst latch 617 may receive the reset signal RST through a reset input terminal R thereof and may receive the internal clock signal ICLK through a clock input terminal C thereof. The seventh burst latch 617 may initialize an output terminal Q thereof to a logic "low" level if the reset signal RST is generated. The seventh burst latch 617 may receive an output signal outputted from the output terminal Q of the sixth burst latch 616 through an input terminal D thereof and may shift the output signal of the sixth burst latch 616 by one cycle of the internal clock signal ICLK to output the shifted signal of the output signal of the sixth burst latch 616 through the output terminal Q thereof.

The eighth burst latch 618 may receive the reset signal RST through a reset input terminal R thereof, may receive the internal clock signal ICLK through a clock input terminal C thereof, and may receive the third shift control signal SC<3> through a selection input terminal S thereof. The eighth burst latch 618 may initialize both of a first output terminal Q1 and a second output terminal Q2 thereof to a logic "low" level if the reset signal RST is generated. The eighth burst latch 618 may receive an output signal outputted from the output terminal Q of the seventh burst latch 617 through an input terminal D thereof and may shift the output signal of the seventh burst latch 617 by one cycle of the internal clock signal ICLK to output the shifted signal of the output signal of the seventh burst latch 617 through the first output terminal Q1. The eighth burst latch 618 may output a signal of the first output terminal Q1 as the internal burst mode signal IBL16S through the second output terminal Q2 if the third shift control signal SC<3> is generated.

Figure 12:
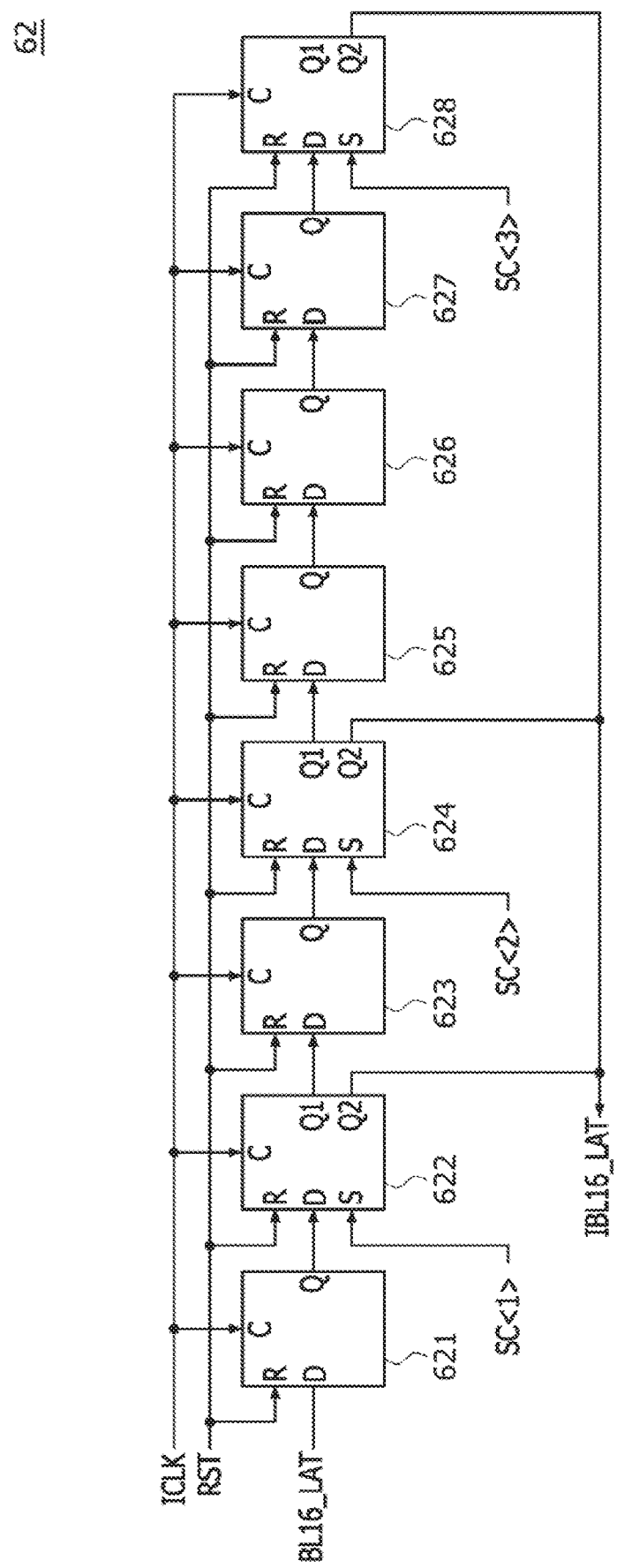
FIG. 12 shows a circuit diagram illustrating an example of an internal latch burst mode signal generation circuit included in the burst mode signal shift circuit of FIG. 10.

Referring to FIG. 12, the internal latched burst mode signal generation circuit 62 may include a first shift burst latch 621, a second shift burst latch 622, a third shift burst latch 623, a fourth shift burst latch 624, a fifth shift burst latch 625, a sixth shift burst latch 626, a seventh shift burst latch 627, and an eighth shift burst latch 628. Each of the first shift burst latch 621, the second shift burst latch 622, the third shift burst latch 623, the fourth shift burst latch 624, the fifth shift burst latch 625, the sixth shift burst latch 626, the seventh shift burst latch 627, and the eighth shift burst latch 628 may be realized using a D-flip flop.

The first shift burst latch 621 may receive the reset signal RST through a reset input terminal R thereof and may receive the internal clock signal ICLK through a clock input terminal C thereof. The first shift burst latch 621 may initialize an output terminal Q thereof to a logic "low" level if the reset signal RST is generated. The first shift burst latch 621 may shift the latched burst mode signal BL16_LAT inputted to an input terminal D thereof by one cycle of the internal clock signal ICLK to output the shifted signal of the latched burst mode signal BL16_LAT through the output terminal Q.

The second shift burst latch 622 may receive the reset signal RST through a reset input terminal R thereof, may receive the internal clock signal ICLK through a clock input terminal C thereof, and may receive the first shift control signal SC<1> through a selection input terminal S thereof. The second shift burst latch 622 may initialize both of a first output terminal Q1 and a second output terminal Q2 thereof to a logic "low" level if the reset signal RST is generated. The second shift burst latch 622 may receive an output signal outputted from the output terminal Q of the first shift burst latch 621 through an input terminal D thereof and may shift the output signal of the first shift burst latch 621 by one cycle of the internal clock signal ICLK to output the shifted signal of the output signal of the first shift burst latch 621 through the first output terminal Q1, The second shift burst latch 622 may output a signal of the first output terminal Q1 as the internal latched burst mode signal IBL16_LAT through the second output terminal Q2 if the first shift control signal SC<1> is generated.

The third shift burst latch 623 may receive the reset signal RST through a reset input terminal R thereof and may receive the internal clock signal ICLK through a clock input terminal C thereof. The third shift burst latch 623 may initialize an output terminal Q thereof to a logic "low" level if the reset signal RST is generated. The third shift burst latch 623 may receive a first output signal outputted from the first output terminal Q1 of the second shift burst latch 622 through an input terminal D thereof and may shift the first output signal of the second shift burst latch 622 by one cycle of the internal clock signal ICLK to output the shifted signal of the first output signal of the second shift burst latch 622 through the output terminal Q thereof.

The fourth shift burst latch 624 may receive the reset signal RST through a reset input terminal R thereof, may receive the internal clock signal ICLK through a clock input terminal C thereof, and may receive the second shift control signal SC<2> through a selection input terminal S thereof. The fourth shift burst latch 624 may initialize both of a first output terminal Q1 and a second output terminal Q2 thereof to a logic "low" level if the reset signal RST is generated. The fourth shift burst latch 624 may receive an output signal outputted from the output terminal Q of the third shift burst latch 623 through an input terminal D thereof and may shift the output signal of the third shift burst latch 623 by one cycle of the internal clock signal ICLK to output the shifted signal of the output signal of the third shift burst latch 623 through the first output terminal Q1. The fourth shift burst latch 624 may output a signal of the first output terminal Q1 as the internal latched burst mode signal IBL16_LAT through the second output terminal Q2 if the second shift control signal SC<2> is generated.

The fifth shift burst latch 625 may receive the reset signal RST through a reset input terminal R thereof and may receive the internal clock signal ICLK through a clock input terminal C thereof. The fifth shift burst latch 625 may initialize an output terminal Q thereof to a logic "low" level if the reset signal RST is generated. The fifth shift burst latch 625 may receive a first output signal outputted from the first output terminal Q1 of the fourth shift burst latch 624 through an input terminal D thereof and may shift the first output signal of the fourth shift burst latch 624 by one cycle of the internal clock signal ICLK to output the shifted signal of the first output signal of the fourth shift burst latch 624 through the output terminal Q thereof.

The sixth shift burst latch 626 may receive the reset signal RST through a reset input terminal R thereof and may receive the internal clock signal ICLK through a dock input terminal C thereof. The sixth shift burst latch 626 may initialize an output terminal Q thereof to a logic "low" level if the reset signal RST is generated. The sixth shift burst latch 626 may receive an output signal outputted from the output terminal Q of the fifth shift burst latch 625 through an input terminal D thereof and may shift the output signal of the fifth shift burst latch 625 by one cycle of the internal clock signal ICLK to output the shifted signal of the output signal of the fifth shift burst latch 625 through the output terminal Q thereof.

The seventh shift burst latch 627 may receive the reset signal RST through a reset input terminal R thereof and may receive the internal clock signal ICLK through a clock input terminal C thereof. The seventh shift burst latch 627 may initialize an output terminal Q thereof to a logic "low" level if the reset signal RST is generated. The seventh shift burst latch 627 may receive an output signal outputted from the output terminal Q of the sixth shift burst latch 626 through an input terminal D thereof and may shift the output signal of the sixth shift burst latch 626 by one cycle of the internal clock signal ICLK to output the shifted signal of the output signal of the sixth shift burst latch 626 through the output terminal Q thereof.

The eighth shift burst latch 628 may receive the reset signal RST through a reset input terminal R thereof, may receive the internal clock signal ICLK through a clock input terminal C thereof, and may receive the third shift control signal SC<3> through a selection input terminal S thereof. The eighth shift burst latch 628 may initialize both of a first output terminal Q1 and a second output terminal Q2 thereof to a logic "low" level if the reset signal RST is generated. The eighth shift burst latch 628 may receive an output signal outputted from the output terminal Q of the seventh shift burst latch 627 through an input terminal D thereof and may shift the output signal of the seventh shift burst latch 627 by one cycle of the internal clock signal ICLK to output the shifted signal of the output signal of the seventh shift burst latch 627 through the first output terminal Q1. The eighth shift burst latch 628 may output a signal of the first output terminal Q1 as the internal latched burst mode signal IBL16_LAT through the second output terminal Q2 if the third shift control signal SC<3> is generated.

Figure 13:
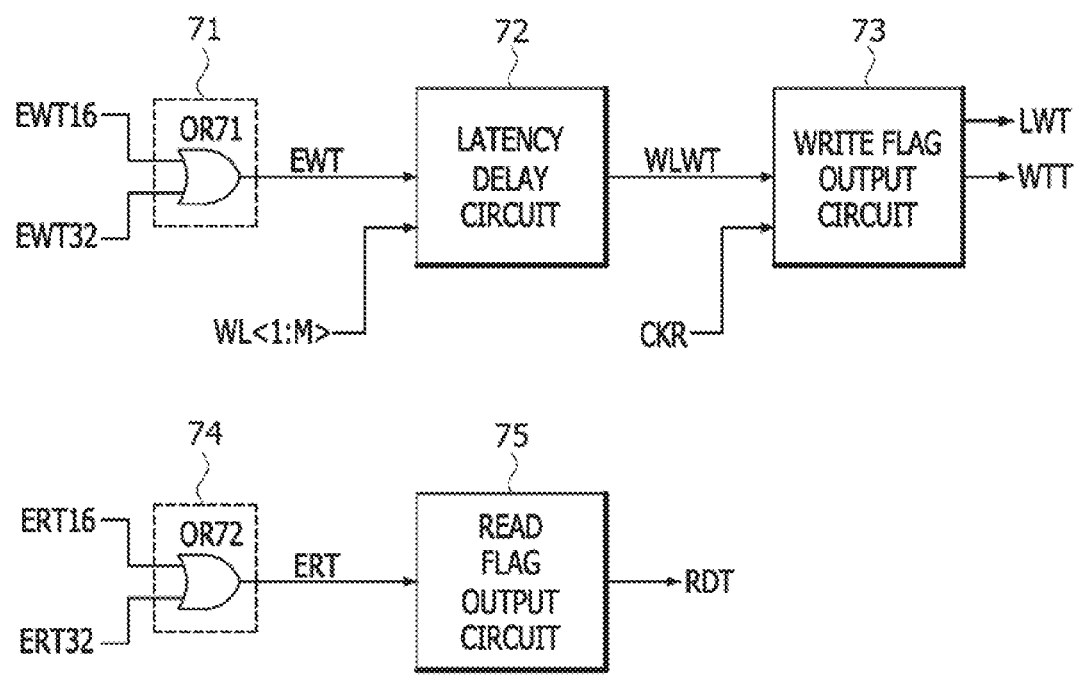
FIG. 13 illustrates an example of a flag generation circuit included in the semiconductor device of FIG. 1.

Referring to FIG. 13, the flag generation circuit 108 may include a write synthesis circuit 71, a latency delay circuit 72, a write flag output circuit 73, a read synthesis circuit 74, and a read flag output circuit 75. The write synthesis circuit 71 may include an OR gate OR71, The OR gate OR71 may perform a logical OR operation of the first write signal EWT16 and the second write signal EWT32. The write synthesis circuit 71 may generate a synthesized write signal EWT if the first write signal EWT16 or the second write signal EWT32 is generated. The latency delay circuit 72 may delay the synthesized write signal EWT by a write latency period determined by the write latency signal WL<1:M> to generate a latency write signal WLWT. The write flag output circuit 73 may shift the latency write signal WLWT by a period determined based on the clock information signal CKR to generate the pre-write flag LWT and the write flag WTT. For example, the write flag output circuit 73 may shift the latency write signal WLWT by two cycles of the internal clock signal ICLK to generate the pre-write flag LWT and may shift the pre-write flag LWT by one cycle of the internal clock signal ICLK to generate the write flag WTT, if a frequency ratio of the data clock signal WCK to the internal clock signal ICLK is four. The read synthesis circuit 74 may include an OR gate OR72. The OR gate OR72 may perform a logical OR operation of the first read signal ERT16 and the second read signal ERT32. The read synthesis circuit 74 may generate a synthesized read signal ERT if the first read signal ERT16 or the second read signal ERT32 is generated. The read flag output circuit 75 may shift the synthesized read signal ERT by a predetermined period to generate the read flag RDT. For example, the read flag output circuit 75 may shift the synthesized read signal ERT by one cycle of the internal clock signal ICLK to generate the read flag RDT.

Figure 14:
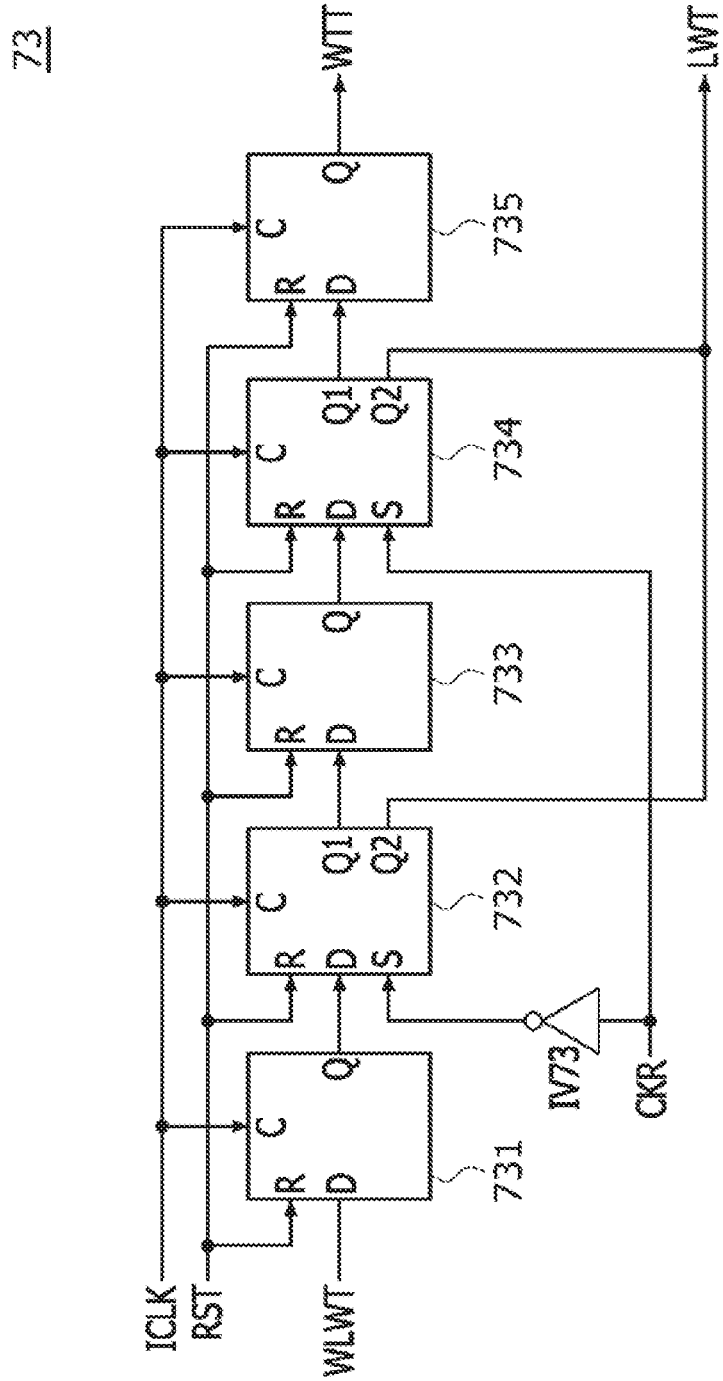
FIG. 14 shows a circuit diagram illustrating an example of a write flag output circuit included in the flag generation circuit of FIG. 13.

Referring to FIG. 14, the write flag output circuit 73 may include an inverter IV73, a first clock latch 731, a second clock latch 732, a third clock latch 733, a fourth clock latch 734, and a fifth clock latch 735. Each of the first clock latch 731, the second clock latch 732, the third clock latch 733, the fourth clock latch 734, and the fifth dock latch 735 may be realized using a D-flip flop.

The first clock latch 731 may receive the reset signal RST through a reset input terminal R thereof and may receive the internal clock signal ICLK through a clock input terminal C thereof. The first clock latch 731 may initialize an output terminal Q thereof to a logic "low" level if the reset signal RST is generated. The first clock latch 731 may shift the latency write signal WLWT inputted to an input terminal D thereof by one cycle of the internal clock signal ICLK to output the shifted signal of the latency write signal WLWT through the output terminal Q.

The second clock latch 732 may receive the reset signal RST through a reset input terminal R thereof, may receive the internal clock signal ICLK through a clock input terminal C thereof, and may receive an output signal of the inverter IV73 through a selection input terminal S thereof. The inverter IV73 may inversely buffer the clock information signal CKR to output the inversely buffered signal of the clock information signal CKR. The second clock latch 732 may initialize both of a first output terminal Q1 and a second output terminal Q2 thereof to a logic "low" level if the reset signal RST is generated. The second clock latch 732 may receive an output signal outputted from the output terminal Q of the first clock latch 731 through an input terminal D thereof and may shift the output signal of the first clock latch 731 by one cycle of the internal clock signal ICLK to output the shifted signal of the output signal of the first clock latch 731 through the first output terminal Q1. The second clock latch 732 may output a signal of the first output terminal Q1 as the pre-write flag LWT through the second output terminal Q2 if the clock information signal CKR is generated to have a logic "low" level by setting a frequency ratio of the data clock signal WCK to the internal clock signal ICLK as four.

The third clock latch 733 may receive the reset signal RST through a reset input terminal R thereof and may receive the internal clock signal ICLK through a clock input terminal C thereof. The third clock latch 733 may initialize an output terminal Q thereof to a logic "low" level if the reset signal RST is generated. The third clock latch 733 may receive a first output signal outputted from the first output terminal Q1 of the second clock latch 732 through an input terminal D thereof and may shift the first output signal of the second clock latch 732 by one cycle of the internal clock signal ICLK to output the shifted signal of the first output signal of the second clock latch 732 through the output terminal Q thereof.

The fourth clock latch 734 may receive the reset signal RST through a reset input terminal R thereof, may receive the internal clock signal ICLK through a clock input terminal C thereof, and may receive the clock information signal CKR through a selection input terminal S thereof. The fourth clock latch 734 may initialize both of a first output terminal Q1 and a second output terminal Q2 thereof to a logic "low" level if the reset signal RST is generated. The fourth clock latch 734 may receive an output signal outputted from the output terminal Q of the third clock latch 733 through an input terminal D thereof and may shift the output signal of the third clock latch 733 by one cycle of the internal clock signal ICLK to output the shifted signal of the output signal of the third clock latch 733 through the first output terminal Q1. The fourth clock latch 734 may output a signal of the first output terminal Q1 as the pre-write flag LWT through the second output terminal Q2 if the clock information signal CKR is generated to have a logic "high" level by setting a frequency ratio of the data clock signal WCK to the internal clock signal ICLK as two.

The fifth clock latch 735 may receive the reset signal RST through a reset input terminal R thereof and may receive the internal clock signal ICLK through a clock input terminal C thereof. The fifth clock latch 735 may initialize an output terminal Q thereof to a logic "low" level if the reset signal RST is generated. The fifth clock latch 735 may receive the pre-write flag LWT outputted from the first output terminal Q1 of the fourth clock latch 734 through an input terminal D thereof and may shift the pre-write flag LWT by one cycle of the internal clock signal ICLK to output the shifted signal of the pre-write flag LWT as the write flag W through the output terminal Q thereof.

Figure 15:
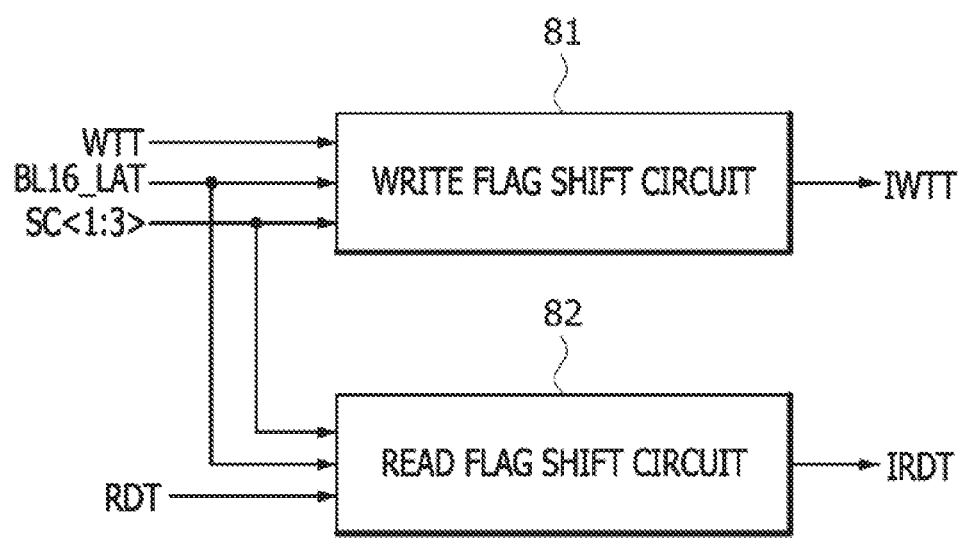
FIG. 15 shows a block diagram illustrating an example of a flag shift circuit included in the semiconductor device of FIG. 1.

Referring to FIG. 15, the flag shift circuit 109 may include a write flag shift circuit 81 and a read flag shift circuit 82. The write flag shift circuit 81 may shift the write flag WTT by a period determined by the first to third shift control signals SC<1:3> to generate the internal write flag IWTT, while the latched burst mode signal BL16_LAT is set to have a logic "low" level by the write operation performed in the 8-bank mode or by the write operation performed while the burst length is set to be "32." For example, the write flag shift circuit 81 may shift the write flag WTT by two cycles of the internal clock signal ICLK to generate the internal write flag IWTT if the first shift control signal SC<1> is generated, may shift the write flag WTT by four cycles of the internal clock signal ICLK to generate the internal write flag IWTT if the second shift control signal SC<2> is generated, and may shift the write flag WTT by eight cycles of the internal clock signal ICLK to generate the internal write flag IWTT if the third shift control signal SC<3> is generated. The read flag shift circuit 82 may shift the read flag RDT by a period determined by the first to third shift control signals SC<1:3> to generate the internal read flag IRDT, while the latched burst mode signal BL16_LAT is set to have a logic "low" level by the read operation performed in the 8-bank mode or by the read operation performed while the burst length is set to be "32." For example, the read flag shift circuit 82 may shift the read flag RDT by two cycles of the internal clock signal ICLK to generate the internal read flag IRDT if the first shift control signal SC<1> is generated, may shift the read flag RDT by four cycles of the internal clock signal ICLK to generate the internal read flag IRDT if the second shift control signal SC<2> is generated, and may shift the read flag RDT by eight cycles of the internal clock signal ICLK to generate the internal read flag IRDT if the third shift control signal SC<3> is generated.

Figure 16:
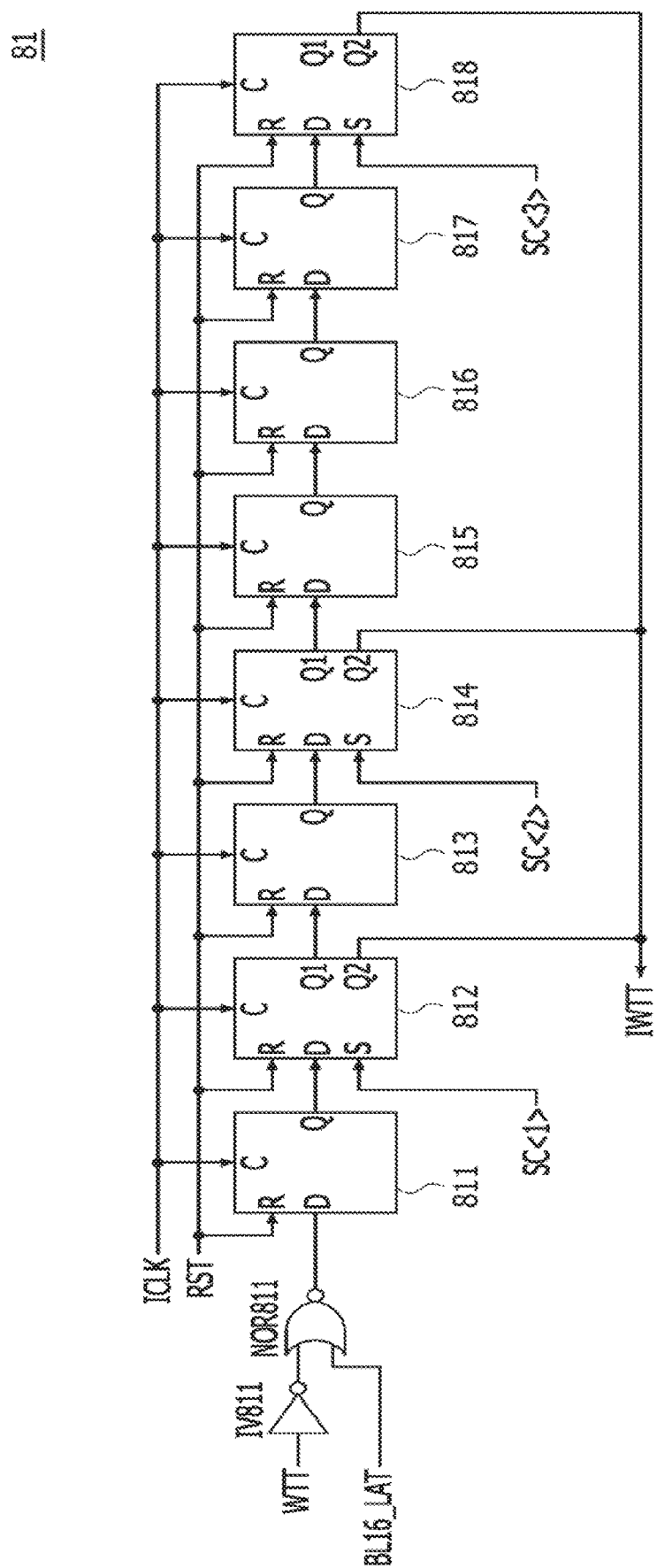
FIG. 16 shows a circuit diagram illustrating an example of a write flag shift circuit included in the flag shift circuit of FIG. 15.

Referring to FIG. 16, the write flag shift circuit 81 may include an inverter IV811, a NOR gate NOR811, a first write flag latch 811, a second write flag latch 812, a third write flag latch 813, a fourth write flag latch 814, a fifth write flag latch 815, a sixth write flag latch 816, a seventh write flag latch 817, and an eighth write flag latch 818. The inverter IV811 may inversely buffer the write flag WTT to output the inversely buffered signal of the write flag WTT. The NOR gate NOR811 may perform a logic NOR operation of an output signal of the inverter IV811 and the latched burst mode signal BL16_LAT. Each of the first write flag latch 811, the second write flag latch 812, the third write flag latch 813, the fourth write flag latch 814, the fifth write flag latch 815, the sixth write flag latch 816, the seventh write flag latch 817, and the eighth write flag latch 818 may be realized using a D-flip flop.

The first write flag latch 811 may receive the reset signal RST through a reset input terminal R thereof and may receive the internal clock signal ICLK through a clock input terminal C thereof. The first write flag latch 811 may initialize an output terminal Q thereof to a logic "low" level if the reset signal RST is generated. The first write flag latch 811 may shift an output signal of the NOR gate NOR811 inputted to an input terminal D thereof by one cycle of the internal clock signal ICLK to output the shifted signal of the output signal of the NOR gate NOR811 through the output terminal Q. The output signal of the NOR gate NOR811 may be set to have a logic "high" level if the write flag WTT is generated to have a logic "high" level while the latched burst mode signal BL16_LAT is set to have a logic "low" level by the write operation performed while the burst length is set to be "32" or by the write operation performed in the 8-bank mode.

The second write flag latch 812 may receive the reset signal RST through a reset input terminal R thereof, may receive the internal clock signal ICLK through a clock input terminal C thereof, and may receive the first shift control signal SC<1> through a selection input terminal S thereof. The second write flag latch 812 may initialize both of a first output terminal Q1 and a second output terminal Q2 thereof to a logic "low" level if the reset signal RST is generated. The second write flag latch 812 may receive an output signal outputted from the output terminal Q of the first write flag latch 811 through an input terminal D thereof and may shift the output signal of the first write flag latch 811 by one cycle of the internal clock signal ICLK to output the shifted signal of the output signal of the first write flag latch 811 through the first output terminal Q1. The second write flag latch 812 may output a signal of the first output terminal Q1 as the internal write flag IWTT through the second output terminal Q2 if the first shift control signal SC<1> is generated.

The third write flag latch 813 may receive the reset signal RST through a reset input terminal R thereof and may receive the internal clock signal ICLK through a clock input terminal C thereof. The third write flag latch 813 may initialize an output terminal Q thereof to a logic "low" level if the reset signal RST is generated. The third write flag latch 813 may receive a first output signal outputted from the first output terminal Q1 of the second write flag latch 812 through an input terminal D thereof and may shift the first output signal of the second write flag latch 812 by one cycle of the internal clock signal ICLK to output the shifted signal of the first output signal of the second write flag latch 812 through the output terminal Q thereof.

The fourth write flag latch 814 may receive the reset signal RST through a reset input terminal R thereof, may receive the internal clock signal ICLK through a clock input terminal C thereof, and may receive the second shift control signal SC<2> through a selection input terminal S thereof. The fourth write flag latch 814 may initialize both of a first output terminal Q1 and a second output terminal Q2 thereof to a logic "low" level if the reset signal RST is generated. The fourth write flag latch 814 may receive an output signal outputted from the output terminal Q of the third write flag latch 813 through an input terminal D thereof and may shift the output signal of the third write flag latch 813 by one cycle of the internal clock signal ICLK to output the shifted signal of the output signal of the third write flag latch 813 through the first output terminal Q1, The fourth write flag latch 814 may output a signal of the first output terminal Q1 as the internal write flag IWTT through the second output terminal Q2 if the second shift control signal SC<2> is generated.

The fifth write flag latch 815 may receive the reset signal RST through a reset input terminal R thereof and may receive the internal clock signal ICLK through a clock input terminal C thereof. The fifth write flag latch 815 may initialize an output terminal Q thereof to a logic "low" level if the reset signal RST is generated. The fifth write flag latch 815 may receive a first output signal outputted from the first output terminal Q1 of the fourth write flag latch 814 through an input terminal D thereof and may shift the first output signal of the fourth write flag latch 814 by one cycle of the internal clock signal ICLK to output the shifted signal of the first output signal of the fourth write flag latch 814 through the output terminal Q thereof.

The sixth write flag latch 816 may receive the reset signal RST through a reset input terminal R thereof and may receive the internal clock signal ICLK through a clock input terminal C thereof. The sixth write flag latch 816 may initialize an output terminal Q thereof to a logic "low" level if the reset signal RST is generated. The sixth write flag latch 816 may receive an output signal outputted from the output terminal Q of the fifth write flag latch 815 through an input terminal D thereof and may shift the output signal of the fifth write flag latch 815 by one cycle of the internal clock signal ICLK to output the shifted signal of the output signal of the fifth write flag latch 815 through the output terminal Q thereof.

The seventh write flag latch 817 may receive the reset signal RST through a reset input terminal R thereof and may receive the internal clock signal ICLK through a clock input terminal C thereof. The seventh write flag latch 817 may initialize an output terminal Q thereof to a logic "low" level if the reset signal RST is generated. The seventh write flag latch 817 may receive an output signal outputted from the output terminal Q of the sixth write flag latch 816 through an input terminal D thereof and may shift the output signal of the sixth write flag latch 816 by one cycle of the internal clock signal ICLK to output the shifted signal of the output signal of the sixth write flag latch 816 through the output terminal Q thereof.

The eighth write flag latch 818 may receive the reset signal RST through a reset input terminal R thereof, may receive the internal clock signal ICLK through a clock input terminal C thereof, and may receive the third shift control signal SC<3> through a selection input terminal S thereof. The eighth write flag latch 818 may initialize both of a first output terminal Q1 and a second output terminal Q2 thereof to a logic "low" level if the reset signal RST is The eighth write flag latch 818 may receive an output signal outputted from the output terminal Q of the seventh write flag latch 817 through an input terminal D thereof and may shift the output signal of the seventh write flag latch 817 by one cycle of the internal clock signal ICLK to output the shifted signal of the output signal of the seventh write flag latch 817 through the first output terminal Q1. The eighth write flag latch 818 may output a signal of the first output terminal Q1 as the internal write flag IWTT through the second output terminal Q2 if the third shift control signal SC<3> is generated.

Figure 17:
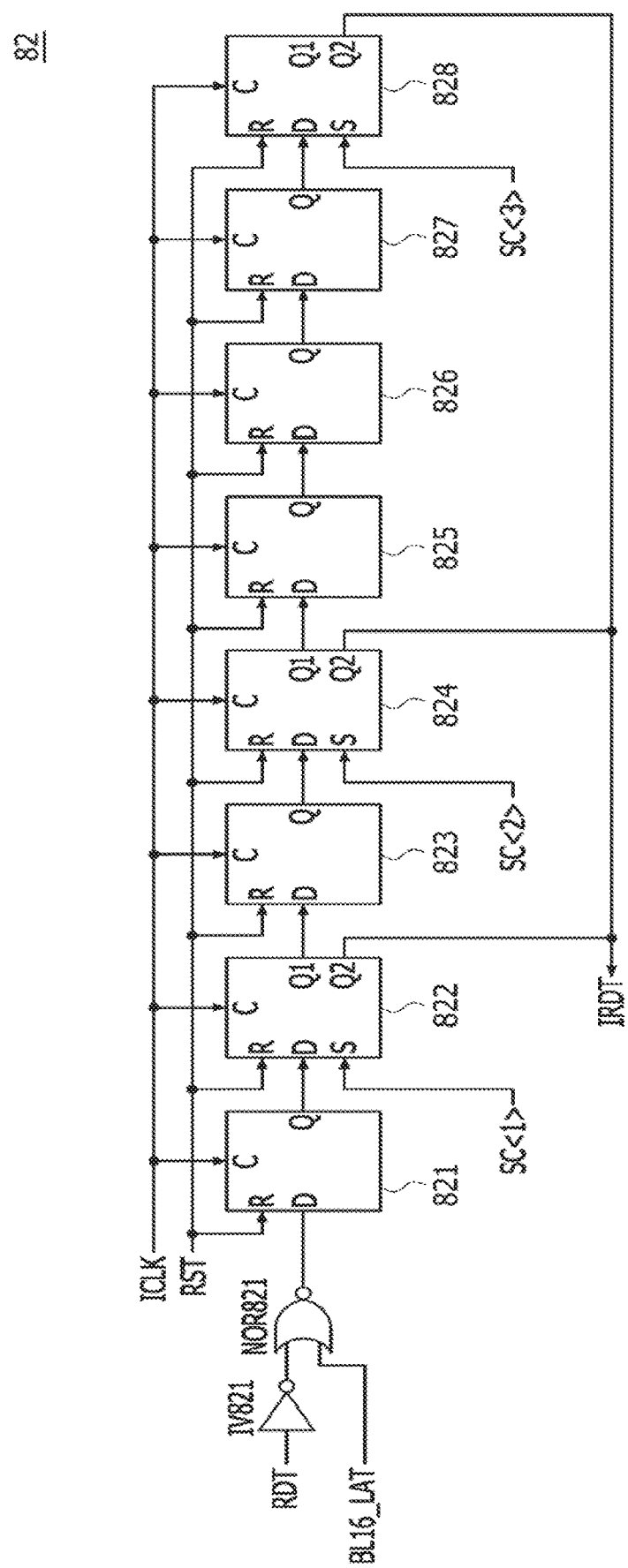
FIG. 17 shows a circuit diagram illustrating an example of a read flag shift circuit included in the flag shift circuit of FIG. 15.

Referring to FIG. 17, the read flag shift circuit 82 may include an inverter IV821, a NOR gate NOR821, a first read flag latch 821, a second read flag latch 822, a third read flag latch 823, a fourth read flag latch 824, a fifth read flag latch 825, a sixth read flag latch 826, a seventh read flag latch 827, and an eighth read flag latch 828. The inverter IV821 may inversely buffer the read flag RDT to output the inversely buffered signal of the read flag RDT. The NOR gate NOR821 may perform a logic NOR operation of an output signal of the inverter IV821 and the latched burst mode signal BL16._LAT. Each of the first read flag latch 821, the second read flag latch 822, the third read flag latch 823, the fourth read flag latch 824, the fifth read flag latch 825, the sixth read flag latch 826, the seventh read flag latch 827, and the eighth read flag latch 828 may be realized using a D-flip flop.

The first read flag latch 821 may receive the reset signal RST through a reset input terminal R thereof and may receive the internal clock signal ICLK through a clock input terminal C thereof. The first read flag latch 821 may initialize an output terminal Q thereof to a logic "low" level if the reset signal RST is generated. The first read flag latch 821 may shift an output signal of the NOR gate NOR821 inputted to an input terminal D thereof by one cycle of the internal clock signal ICLK to output the shifted signal of the output signal of the NOR gate NOR821 through the output terminal Q. The output signal of the NOR gate NOR821 may be set to have a logic "high" level if the read flag RDT is generated to have a logic "high" level while the latched burst mode signal BL16_LAT is set to have a logic "low" level by the read operation performed while the burst length is set to be "32" or by the read operation performed in the 8-bank mode.

The second read flag latch 822 may receive the reset signal RST through a reset input terminal R thereof, may receive the internal clock signal ICLK through a clock input terminal C thereof, and may receive the first shift control signal SC<1> through a selection input terminal S thereof. The second read flag latch 822 may initialize both of a first output terminal Q1 and a second output terminal Q2 thereof to a logic "low" level if the reset signal RST is generated. The second read flag latch 822 may receive an output signal outputted from the output terminal Q of the first read flag latch 821 through an input terminal D thereof and may shift the output signal of the first read flag latch 821 by one cycle of the internal clock signal ICLK to output the shifted signal of the output signal of the first read flag latch 821 through the first output terminal Q1. The second read flag latch 822 may output a signal of the first output terminal Q1 as the internal read flag IRDT through the second output terminal Q2 if the first shift control signal SC<1> is generated.

The third read flag latch 823 may receive the reset signal RST through a reset input terminal R thereof and may receive the internal clock signal ICLK through a clock input terminal C thereof. The third read flag latch 823 may initialize an output terminal Q thereof to a logic "low" level if the reset signal RST is generated. The third read flag latch 823 may receive a first output signal outputted from the first output terminal Q1 of the second read flag latch 822 through an input terminal D thereof and may shift the first output signal of the second read flag latch 822 by one cycle of the internal clock signal ICLK to output the shifted signal of the first output signal of the second read flag latch 822 through the output terminal Q thereof.

The fourth read flag latch 824 may receive the reset signal RST through a reset input terminal R thereof, may receive the internal clock signal ICLK through a clock input terminal C thereof, and may receive the second shift control signal SC<2> through a selection input terminal S thereof. The fourth read flag latch 824 may initialize both of a first output terminal Q1 and a second output terminal Q2 thereof to a logic "low" level if the reset signal RST is generated. The fourth read flag latch 824 may receive an output signal outputted from the output terminal Q of the third read flag latch 823 through an input terminal D thereof and may shift the output signal of the third read flag latch 823 by one cycle of the internal clock signal ICLK to output the shifted signal of the output signal of the third read flag latch 823 through the first output terminal Q1. The fourth read flag latch 824 may output a signal of the first output terminal Q1 as the internal read flag IRDT through the second output terminal Q2 if the second shift control signal SC<2> is generated.

The fifth read flag latch 825 may receive the reset signal RST through a reset input terminal R thereof and may receive the internal clock signal ICLK through a clock input terminal C thereof. The fifth read flag latch 825 may initialize an output terminal Q thereof to a logic "low" level if the reset signal RST is generated. The fifth read flag latch 825 may receive a first output signal outputted from the first output terminal Q1 of the fourth read flag latch 824 through an input terminal D thereof and may shift the first output signal of the fourth read flag latch 824 by one cycle of the internal clock signal ICLK to output the shifted signal of the first output signal of the fourth read flag latch 824 through the output terminal Q thereof.

The sixth read flag latch 826 may receive the reset signal RST through a reset input terminal R thereof and may receive the internal clock signal ICLK through a clock input terminal C thereof. The sixth read flag latch 826 may initialize an output terminal Q thereof to a logic "low" level if the reset signal RST is generated. The sixth read flag latch 826 may receive an output signal outputted from the output terminal Q of the fifth read flag latch 825 through an input terminal D thereof and may shift the output signal of the fifth read flag latch 825 by one cycle of the internal clock signal ICLK to output the shifted signal of the output signal of the fifth read flag latch 825 through the output terminal Q thereof.

The seventh read flag latch 827 may receive the reset signal RST through a reset input terminal R thereof and may receive the internal clock signal ICLK through a clock input terminal C thereof. The seventh read flag latch 827 may initialize an output terminal Q thereof to a logic "low" level if the reset signal RST is generated. The seventh read flag latch 827 may receive an output signal outputted from the output terminal Q of the sixth read flag latch 826 through an input terminal D thereof and may shift the output signal of the sixth read flag latch 826 by one cycle of the internal clock signal ICLK to output the shifted signal of the output signal of the sixth read flag latch 826 through the output terminal Q thereof.

The eighth read flag latch 828 may receive the reset signal RST through a reset input terminal R thereof, may receive the internal clock signal ICLK through a clock input terminal C thereof, and may receive the third shift control signal SC<3> through a selection input terminal S thereof. The eighth read flag latch 828 may initialize both of a first output terminal Q1 and a second output terminal Q2 thereof to a logic "low" level if the reset signal RST is generated. The eighth read flag signal latch 828 may receive an output signal outputted from the output terminal Q of the seventh read flag latch 827 through an input terminal D thereof and may shift the output signal of the seventh read flag latch 827 by one cycle of the internal clock signal ICLK to output the shifted signal of the output signal of the seventh read flag latch 827 through the first output terminal Ql. The eighth read flag latch 828 may output a signal of the first output terminal Q1 as the internal read flag IRDT through the second output terminal Q2 if the third shift control signal SC<3> is generated.

Figure 18:
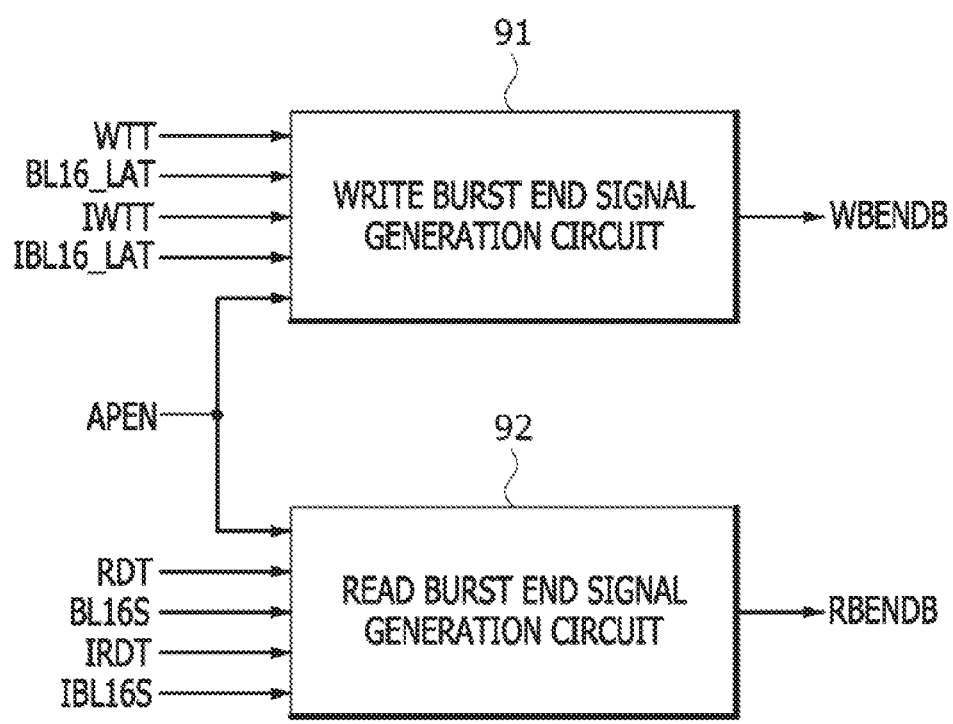
FIG. 18 shows a block diagram illustrating an example of a burst end signal generation circuit included in the semiconductor device of FIG. 1.

Referring to FIG. 18, the burst end signal generation circuit 110 may include a write burst end signal generation circuit 91 and a read burst end signal generation circuit 92.

The write burst end signal generation circuit 91 may latch the auto-pre-charge enablement signal APEN to generate the write burst end signal WBENDB after the write flag WTT and the latched burst mode signal BL16_LAT are set to have predetermined logic levels, respectively. The write burst end signal generation circuit 91 may latch the delayed auto-pre-charge enablement signal (APENd of FIG. 19) to generate the write burst end signal WBENDB after the internal write flag WTT and the internal latched burst mode signal IBL16_LAT are set to have predetermined logic levels, respectively.

The read burst end signal generation circuit 92 may latch the auto-pre-charge enablement signal APEN to generate the read burst end signal RBENDB after the read flag RDT and the burst mode signal BL16S are set to have predetermined logic levels, respectively. The read burst end signal generation circuit 92 may latch the delayed auto-pre-charge enablement signal (APENd of FIG. 19) to generate the read burst end signal RBENDB after the internal read flag IRDT and the internal burst mode signal IBL16S are set to have predetermined logic levels, respectively.

Figure 19:
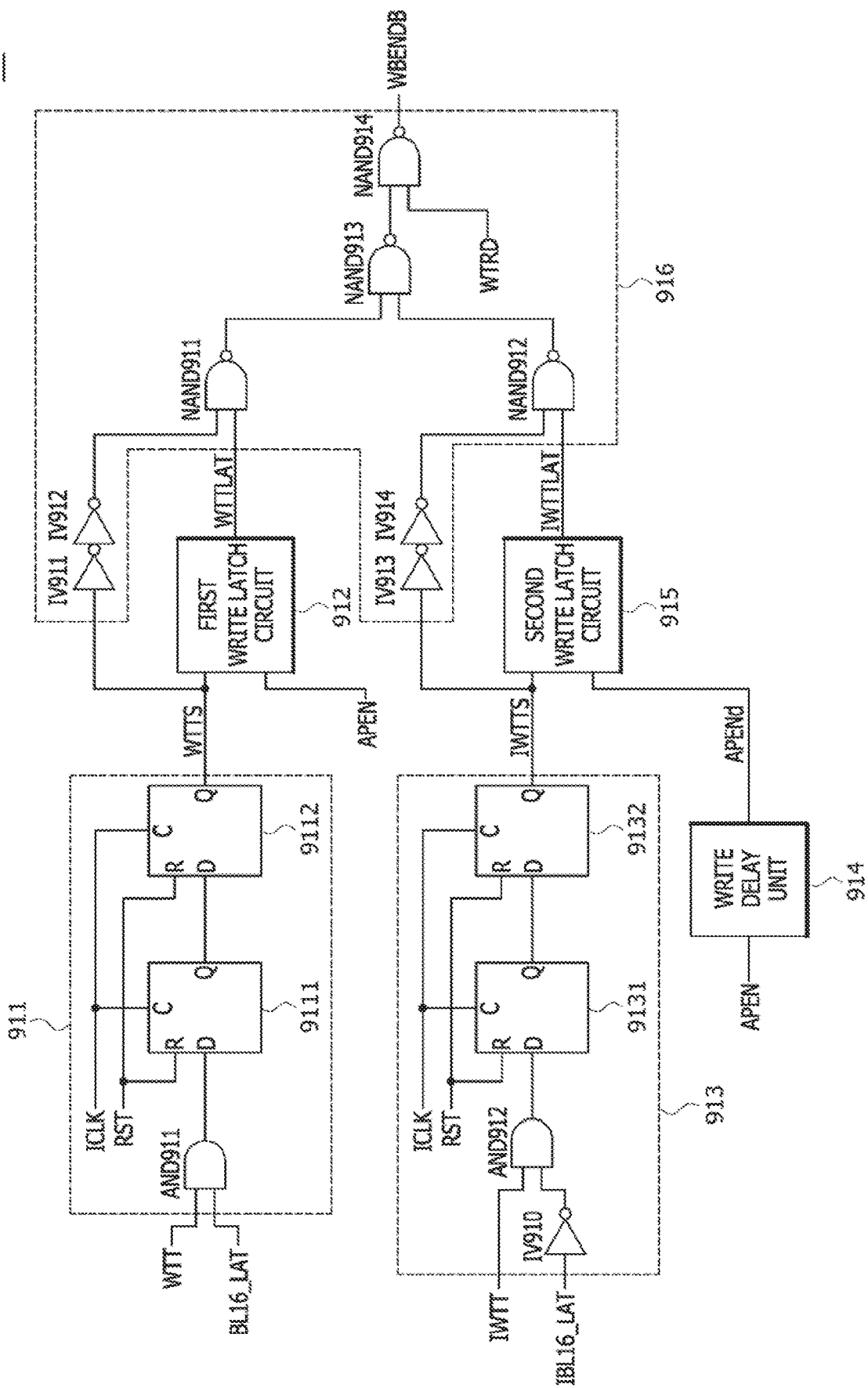
FIG. 19 shows a circuit diagram illustrating an example of a write burst end signal generation circuit included in the burst end signal generation circuit of FIG. 18.

Referring to FIG. 19, the write burst end signal generation circuit 91 may include a shifted write signal generation circuit 911, a first write latch circuit 912, an internal shifted write signal generation circuit 913, a write delay unit 914, a second write latch circuit 915, and a write burst end signal output circuit 916.

The shifted write signal generation circuit 911 may include an AND gate AND911, a first write burst end latch 9111, and a second write burst end latch 9112. The AND gate AND911 may perform a logical AND operation of the write flag WTT and the latched burst mode signal BL16_LAT. The first write burst end latch 9111 may receive the reset signal RST through a reset input terminal R thereof and may receive the internal clock signal ICLK through a clock input terminal C thereof. The first write burst end latch 9111 may initialize an output terminal Q thereof to a logic "low" level if the reset signal RST is generated. The first write burst end latch 9111 may shift an output signal of the AND gate AND911 inputted to an input terminal D thereof by one cycle of the internal clock signal ICLK to output the shifted signal of the output signal of the AND gate AND911 through the output terminal Q thereof. The second write burst end latch 9112 may receive the reset signal RST through a reset input terminal R thereof and may receive the internal clock signal ICLK through a clock input terminal C thereof. The second write burst end latch 9112 may initialize an output terminal Q thereof to a logic "low" level if the reset signal RST is generated. The second write burst end latch 9112 may shift an output signal of the first write burst end latch 9111 inputted to an input terminal D thereof by one cycle of the internal clock signal ICLK to output the shifted signal of the output signal of the first write burst end latch 9111 as a shifted write signal WTTS through the output terminal Q thereof. The shifted write signal generation circuit 911 may generate the shifted write signal WTTS at a point in time when a period corresponding to two cycles of the internal clock signal ICLK elapses from a point in time when the write flag WTT having a logic "high" level is generated while the latched burst mode signal BL16_LAT is set to have a logic "high" level if the write operation is performed while the burst length is set to be "16."

The first write latch circuit 912 may latch the auto-pre-charge enablement signal APEN to generate a latched write signal WTTLAT, at a point in time when the shifted write signal WTTS is generated. A period that the auto-pre-charge enablement signal APEN is enabled to have a logic "high" level may be set by an external signal inputted to the semiconductor device 10. The first write latch circuit 912 may be realized using a cross-coupled latch circuit to generate the latched write signal WTTLAT by latching the auto-pre-charge enablement signal APEN at a point in time when the shifted write signal WTTS is generated.

The internal shifted write signal generation circuit 913 may include an inverter IV910, an AND gate AND912, a third write burst end latch 9131, and a fourth write burst end latch 9132. The inverter IV910 may inversely buffer the internal latched burst mode signal IBL16_LAT to output the inversely buffered signal of the internal latched burst mode signal IBL16_LAT. The AND gate AND912 may perform a logical AND operation of the internal write flag IWTT and an output signal of the inverter IV910. The third write burst end latch 9131 may receive the reset signal RST through a reset input terminal R thereof and may receive the internal clock signal ICLK through a clock input terminal C thereof. The third write burst end latch 9131 may initialize an output terminal Q thereof to a logic "low" level if the reset signal RST is generated. The third write burst end latch 9131 may shift an output signal of the AND gate AND912 inputted to an input terminal D thereof by one cycle of the internal clock signal ICLK to output the shifted signal of the output signal of the AND gate AND912 through the output terminal Q thereof. The fourth write burst end latch 9132 may receive the reset signal RST through a reset input terminal R thereof and may receive the internal clock signal ICLK through a clock input terminal C thereof. The fourth write burst end latch 9132 may initialize an output terminal Q thereof to a logic "low" level if the reset signal RST is generated. The fourth write burst end latch 9132 may shift an output signal of the third write burst end latch 9131 inputted to an input terminal D thereof by one cycle of the internal clock signal ICLK to output the shifted signal of the output signal of the third write burst end latch 9131 as an internal shifted write signal IWTTS through the output terminal Q thereof. The internal shifted write signal generation circuit 913 may generate the internal shifted write signal IWTTS at a point in time when a period corresponding to two cycles of the internal clock signal ICLK elapses from a point in time when the internal write flag IWTT having a logic "high" level is generated while the internal latched burst mode signal IBL16_LAT is set to have a logic "low" level if the write operation is performed while the burst length is set to be "32."

The write delay unit 914 may delay the auto-pre-charge enablement signal APEN to generate the delayed auto-pre-charge enablement signal APENd. The second write latch circuit 915 may latch the delayed auto-pre-charge enablement signal APENd to generate an internal latched write signal IWTTLAT, at a point in time when the internal shifted write signal IWTTS is generated. The second write latch circuit 915 may be realized using a cross-coupled latch circuit to generate the internal latched write signal IWTTLAT by latching the delayed auto-pre-charge enablement signal APENd at a point in time when the internal shifted write signal IWTTS is generated.

The write burst end signal output circuit 916 may include inverters IV911~IV914 and NAND gates NAND911~NAND914. The inverters IV911 and IV912 may be coupled in series to buffer the shifted write signal WTTS and to output the buffered signal of the shifted write signal WTTS. The NAND gate NAND911 may perform a logical NAND operation of an output signal of the inverters IV911 and IV912 and the latched write signal WTTLAT. The inverters IV913 and IV914 may be coupled in series to buffer the internal shifted write signal IWTTS and to output the buffered signal of the internal shifted write signal IWTTS. The NAND gate NAND912 may perform a logical NAND operation of an output signal of the inverters IV913 and IV914 and the internal latched write signal IWTTLAT. The NAND gate NAND913 may perform a logical NAND operation of an output signal of the NAND gate NAND911 and an output signal of the NAND gate NAND912. The NAND gate NAND914 may perform a logical NAND operation of an output signal of the NAND gate NAND913 and a write/read flag WTRD. The write/read flag WTRD may be set to have a logic "high" level during the write operation and may be set to have a logic "low" level during the read operation.

The write burst end signal generation circuit 91 may latch the auto-pre-charge enablement signal APEN based on the write flag WTT to generate the write burst end signal WBENDB for terminating the burst operation, if the write operation is performed while the burst length is set to be "16." The write burst end signal generation circuit 91 may latch the delayed auto-pre-charge enablement signal APENd based on the internal write flag IWTT to generate the write burst end signal WBENDB for terminating the burst operation, if the write operation is performed while the burst length is set to be "32" or the write operation is performed while the bank mode is set to be the 8-bank mode.

Figure 20:
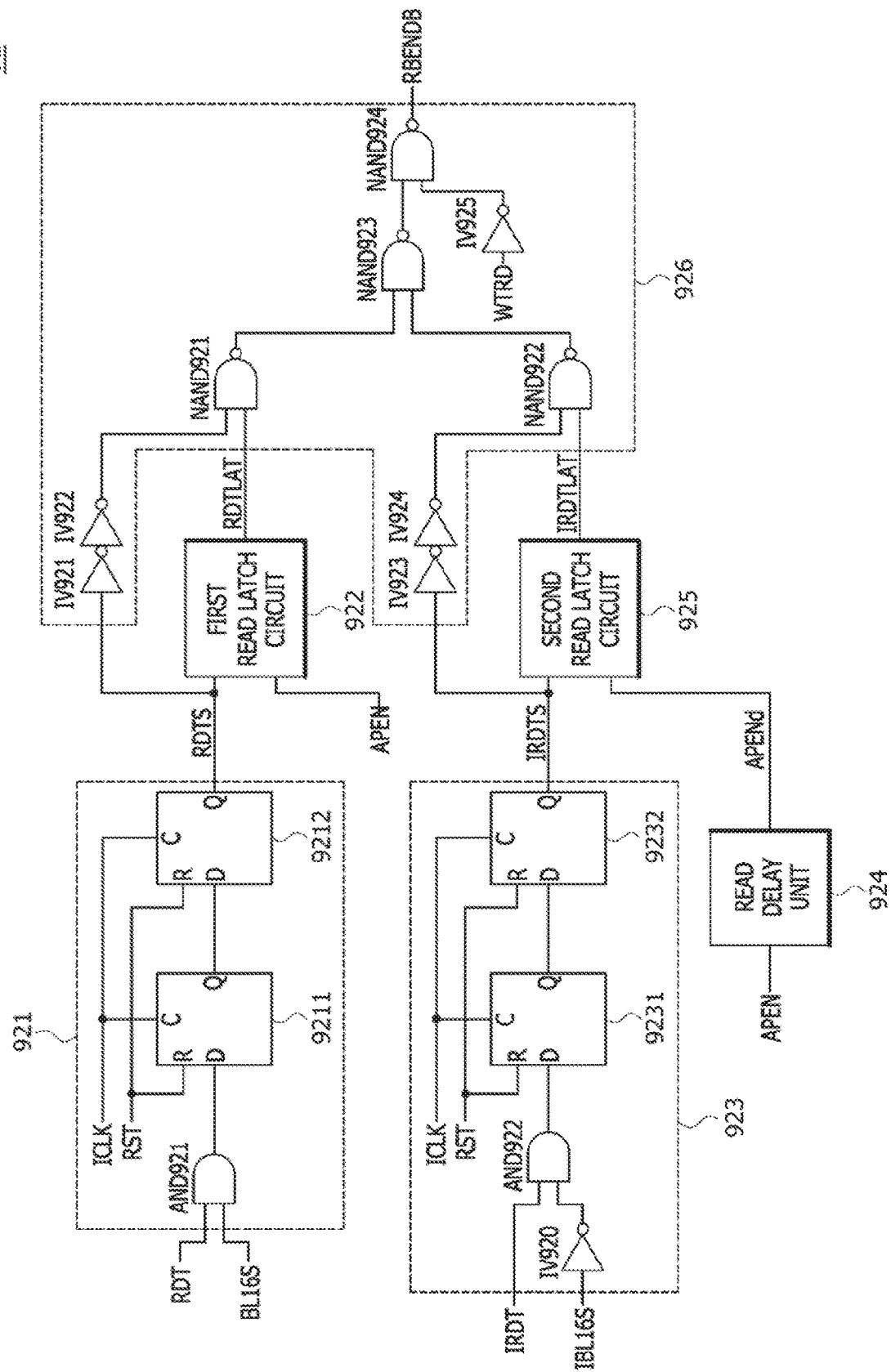
FIG. 20 shows a circuit diagram illustrating an example of a read burst end signal generation circuit included in the burst end signal generation circuit of FIG. 18.

Referring to FIG. 20, the read burst end signal generation circuit 92 may include a shifted read signal generation circuit 921, a first read latch circuit 922, an internal shifted read signal generation circuit 923, a read delay unit 924, a second read latch circuit 925, and a read burst end signal output circuit 926.

The shifted read signal generation circuit 921 may include an AND gate AND921, a first read burst end latch 9211, and a second read burst end latch 9212. The AND gate AND921 may perform a logical AND operation of the read flag RDT and the burst mode signal BL16S. The first read burst end latch 9211 may receive the reset signal RST through a reset input terminal R thereof and may receive the internal clock signal ICLK through a clock input terminal C thereof. The first read burst end latch 9211 may initialize an output terminal Q thereof to a logic "low" level if the reset signal RST is generated. The first read burst end latch 9211 may shift an output signal of the AND gate AND921 inputted to an input terminal D thereof by one cycle of the internal clock signal ICLK to output the shifted signal of the output signal of the AND gate AND921 through the output terminal Q thereof. The second read burst end latch 9212 may receive the reset signal RST through a reset input terminal R thereof and may receive the internal clock signal ICLK through a clock input terminal C thereof. The second read burst end latch 9212 may initialize an output terminal Q thereof to a logic "low" level if the reset signal RST is generated. The second read burst end latch 9212 may shift an output signal of the first read burst end latch 9211 inputted to an input terminal D thereof by one cycle of the internal clock signal ICLK to output the shifted signal of the output signal of the first read burst end latch 9211 as a shifted read signal RDTS through the output terminal Q thereof. The shifted read signal generation circuit 921 may generate the shifted read signal RDTS at a point in time when a period corresponding to two cycles of the internal clock signal ICLK elapses from a point in time when the read flag RDT having a logic "high" level is generated while the burst mode signal BL16S is set to have a logic "high" level if the read operation is performed while the burst length is set to be "16."

The first read latch circuit 922 may latch the auto-pre-charge enablement signal APEN to generate a latched read signal RDTLAT, at a point in time when the shifted read signal RDTS is generated. The first read latch circuit 922 may be realized using a cross-coupled latch circuit to generate the latched read signal RDTLAT by latching the auto-pre-charge enablement signal APEN at a point in time when the shifted read signal RDTS is generated.

The internal shifted read signal generation circuit 923 may include an inverter IV920, an AND gate AND922, a third read burst end latch 9231, and a fourth read burst end latch 9232. The inverter IV920 may inversely buffer the internal burst mode signal IBL16S to output the inversely buffered signal of the internal burst mode signal IBL16S. The AND gate AND922 may perform a logical AND operation of the internal read flag IRDT and an output signal of the inverter IV920. The third read burst end latch 9231 may receive the reset signal RST through a reset input terminal R thereof and may receive the internal clock signal ICLK through a clock input terminal C thereof. The third read burst end latch 9231 may initialize an output terminal Q thereof to a logic "low" level if the reset signal RST is generated. The third read burst end latch 9231 may shift an output signal of the AND gate AND922 inputted to an input terminal D thereof by one cycle of the internal clock signal ICLK to output the shifted signal of the output signal of the AND gate AND922 through the output terminal Q thereof. The fourth read burst end latch 9232 may receive the reset signal RST through a reset input terminal R thereof and may receive the internal clock signal ICLK through a clock input terminal C thereof. The fourth read burst end latch 9232 may initialize an output terminal Q thereof to a logic "low" level if the reset signal RST is generated. The fourth read burst end latch 9232 may shift an output signal of the third read burst end latch 9231 inputted to an input terminal D thereof by one cycle of the internal clock signal ICLK to output the shifted signal of the output signal of the third read burst end latch 9231 as an internal shifted read signal IRDTS through the output terminal Q thereof. The internal shifted read signal generation circuit 923 may generate the internal shifted read signal IRDTS at a point in time when a period corresponding to two cycles of the internal clock signal ICLK elapses from a point in time when the internal read flag IRDT having a logic "high" level is generated while the internal burst mode signal IBL16S is set to have a logic "low" level if the read operation is performed while the burst length is set to be "32."

The read delay unit 924 may delay the auto-pre-charge enablement signal APEN to generate the delayed auto-pre-charge enablement signal APENd. The second read latch circuit 925 may latch the delayed auto-pre-charge enablement signal APENd to generate an internal latched read signal IRDTLAT, at a point in time when the internal shifted read signal IRDTS is generated. The second read latch circuit 925 may be realized using a cross-coupled latch circuit to generate the internal latched read signal IRDTLAT by latching the delayed auto-pre-charge enablement signal APENd at a point in time when the internal shifted read signal IRDTS is generated.

The read burst end signal output circuit 926 may include inverters IV921~IV925 and NAND gates NAND921~NAND924. The inverters IV921 and IV922 may be coupled in series to buffer the shifted read signal RDTS and to output the buffered signal of the shifted read signal RDTS. The NAND gate NAND921 may perform a logical NAND operation of an output signal of the inverters IV921 and IV922 and the latched read signal RDTLAT. The inverters IV923 and IV924 may be coupled in series to buffer the internal shifted read signal IRDTS and to output the buffered signal of the internal shifted read signal IRDTS. The NAND gate NAND922 may perform a logical NAND operation of an output signal of the inverters IV923 and IV924 and the internal latched read signal IRDTLAT. The NAND gate NAND923 may perform a logical NAND operation of an output signal of the NAND gate NAND921 and an output signal of the NAND gate NAND922. The inverter IV925 may inversely buffer the write/read flag WTRD to output the inversely buffered signal of the write/read flag WTRD. The NAND gate NAND924 may perform a logical NAND operation of an output signal of the NAND gate NAND923 and an output signal of the inverter IV925.

The read burst end signal generation circuit 92 may latch the auto-pre-charge enablement signal APEN based on the read flag RDT to generate the read burst end signal RBENDB for terminating the burst operation, if the read operation is performed while the burst length is set to be "16." The read burst end signal generation circuit 92 may latch the delayed auto-pre-charge enablement signal APENd based on the internal read flag IRDT to generate the read burst end signal RBENDB for terminating the burst operation, if the read operation is performed while the burst length is set to be "32" or the read operation is performed while the bank mode is set to be the 8-bank mode.

Figure 21:
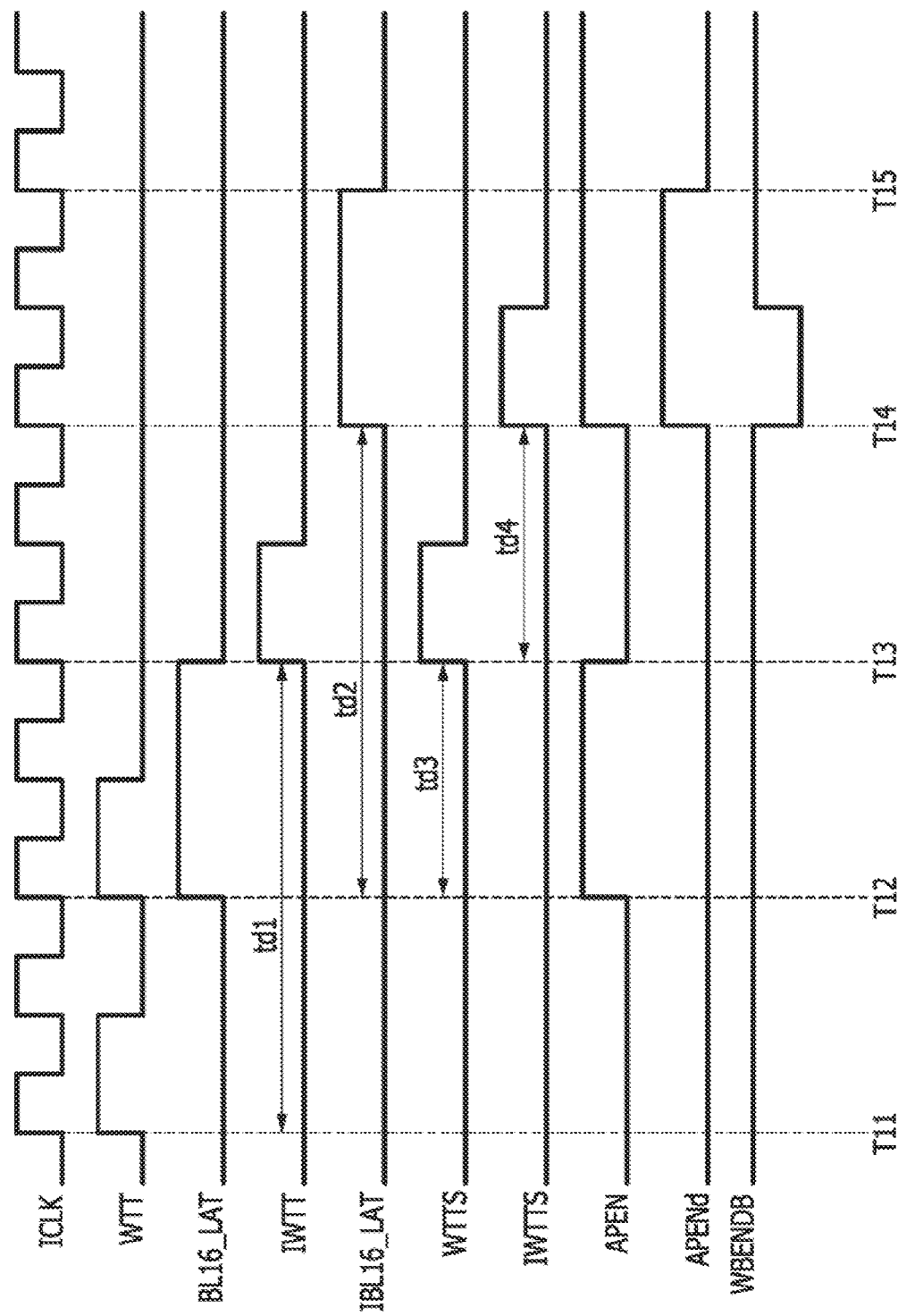
FIG. 21 shows a timing diagram illustrating an operation of the semiconductor device shown in FIGS. 1 to 20.

An operation of generating the write burst end signal WBENDB is described below with reference to FIG. 21 in conjunction with an example in which the write operation with the burst length of "32" and the write operation with the burst length of "16" are sequentially performed. In such a case, it may be assumed that the second shift control signal SC<2> among the first to third shift control signals SC<1:3> is generated.

The write flag WTT may be generated to have a logic "high" level by the write operation performed with the burst length of "32" at a point in time "T11," and the internal write flag IWTT may be generated at a point in time "T13" when a period "td1" corresponding to four cycles of the internal clock signal ICLK elapses from a point in time when the write flag WTT is generated by the second shift control signal SC<2>. At a point in time "T12," the write flag WTT may be generated to have a logic "high" level and a level of the latched burst mode signal BL16_LAT may be changed from a logic "low" level to a logic "high" level, by the write operation performed with the burst length of "16." The internal latched burst mode signal IBL16_LAT may be generated at a point in time "T14" when a period "td2" corresponding to four cycles of the internal clock signal ICLK elapses from the point in time "T12" when the latched burst mode signal BL16_LAT is generated by the second shift control signal SC<2>.

The shifted write signal WTTS may be generated to have a logic "high" level at the point in time "T13" when a period "td3" corresponding to two cycles of the internal clock signal ICLK elapses from the point in time "T12" when the write flag WTT is generated to have a logic "high" level while the latched burst mode signal BL16_LAT is set to have a logic "high" level by the write operation performed with the burst length of "16." The internal shifted write signal IWTTS may be generated to have a logic "high" level at the point in time "T14" when a period "td4" corresponding to two cycles of the internal clock signal ICLK elapses from the point in time "T13" when the internal write flag IWTT is generated to have a logic "high" level while the internal latched burst mode signal IBL16_LAT is set to have a logic "low" level by the write operation performed with the burst length of "32."

If the auto-pre-charge enablement signal APEN is set to have a logic "low" level during a period from the point in time "T11" until the point in time "T12," to have a logic "high" level during a period from the point in time "T12" until the point in time "T13," to have a logic "low" level during a period from the point in time "T13" until the point in time "T14," and to have a logic "high" level after the point in time "T14," the delayed auto-pre-charge enablement signal APENd may be set to have a logic "high" level during a period from the point in time "T14" until a point in time "T15."

Because the auto-pre-charge enablement signal APEN is set to have a logic "low" level at the point in time "T13" when the shifted write signal WTTS is generated to have a logic "high" level, the write burst end signal WBENDB may maintain a logic "high" level even after the point in time "T13." Since the delayed auto-pre-charge enablement signal APENd is set to have a logic "high" level at the point in time "T14" when the internal shifted write signal IWTTS is generated to have a logic "high" level, the write burst end signal WBENDB may be generated to have a logic "low" level at the point in time "T14," If the write burst end signal WBENDB is generated to have a logic "low" level, then the auto-pre-charge operation may be performed.

As described above, a semiconductor device according to an embodiment may control points in time when burst operations terminate based on a burst length if the burst operations are successively performed and may freely control execution or non-execution of the auto-pre-charge operation by setting a logic level of the auto-pre-charge enablement signal APEN. In addition, a circuit for controlling the end points in time of the burst operations based on a burst length may be realized using a circuit such as a shift register, thereby controlling the execution or non-execution of the auto-pre-charge operation while reducing circuit layout area and power consumption.

Figure 22:
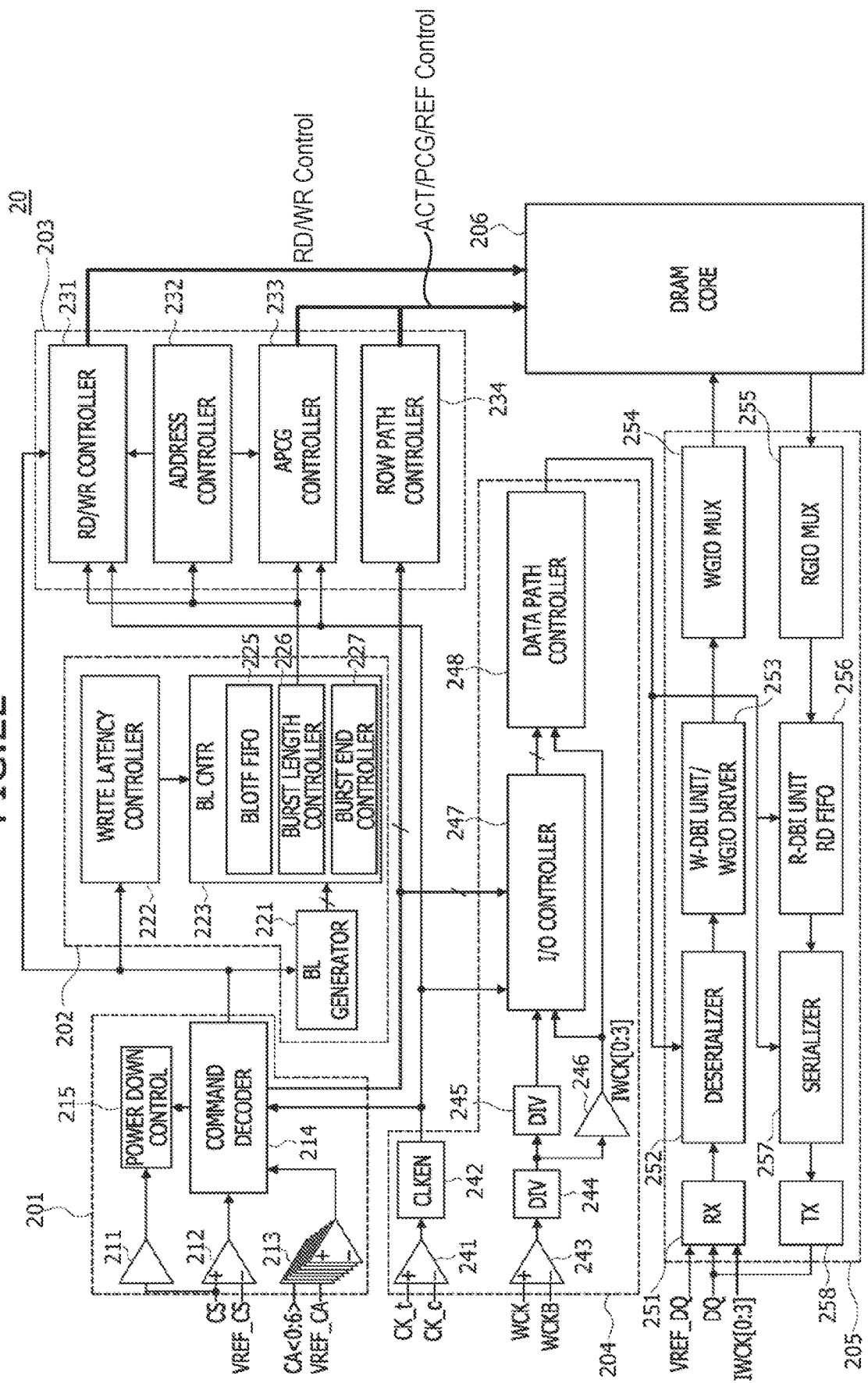
FIG. 22 shows a block diagram illustrating a configuration of a semiconductor device, according to another embodiment of the present disclosure.

Referring to FIG. 22, a semiconductor device 20, according to another embodiment, may include a command control circuit 201, a latency/burst control circuit 202, an operation control circuit 203, an input/output (I/O) control circuit 204, a data I/O circuit 205, and a DRAM core 206.

The command control circuit 201 may include an input drive circuit 211, a chip selection signal buffer 212, a command/address buffer 213, a command decoder 214, and a power-down control circuit 215, The input drive circuit 211 may receive and drive a chip selection signal CS to transmit the chip selection signal CS to the power-down control circuit 215. The chip selection signal buffer 212 may buffer the chip selection signal CS based on a chip selection reference voltage VREF_CS. The command/address buffer 213 may buffer a command/address signal CA<0:6> based on a command/address reference voltage VREF_CA. The command decoder 214 may decode the command/address signal CA<0:6> buffered by the command/address buffer 213 based on the chip selection signal CS buffered by the chip selection signal buffer 212 to generate various commands necessary for the operation of the semiconductor device 20. The power-down control circuit 215 may control a power-down mode based on the chip selection signal CS driven by the input drive circuit 211 and a command generated by the command decoder 214.

The latency/burst control circuit 202 may include a burst length information generator 221, a write latency controller 222, and a burst length control circuit 223. The burst length information generator 221 may generate information necessary for control of a burst length operation based on a command generated by the command decoder 214. The write latency controller 222 may perform a control operation according to a write latency based on a command generated by the command decoder 214. The burst length control circuit 223 may include an information storage circuit 225 storing information outputted from the burst length information generator 221. The burst length control circuit 223 may include a burst length controller 226 for controlling the burst length operation based on a command generated by the command decoder 214, a signal outputted from the write latency controller 222, and information outputted from the burst length information generator 221. The burst length control circuit 223 may include a burst end controller 227 for controlling a burst end operation based on a command generated by the command decoder 214, a signal outputted from the write latency controller 222, and information outputted from the burst length information generator 221.

The operation control circuit 203 may include a read/write controller 231, an address controller 232, an auto-pre-charge controller 233, and a row path controller 234 to generate a read/write control signal RD/WR_Control for controlling a read operation and a write operation as well as a row path control signal ACT/PCG/REF_Control for controlling an active operation, a pre-charge operation, and a refresh operation. The read/write controller 231 may control the read operation and the write operation based on a signal outputted from the latency/burst control circuit 202 and a signal outputted from the address controller 232 if clock signals CK_t and CK_c are activated. The address controller 232 may control generation of an address based on a signal outputted from the latency/burst control circuit 202. The auto-pre-charge controller 233 may control an auto-pre-charge operation based on a signal outputted from the latency/burst control circuit 202 if the clock signals CK_t and CK_c are activated. The row path controller 234 may control a row path based on a command generated by the command decoder 214.

The I/O control circuit 204 may include a first clock buffer 241, a clock enablement signal generator 242, a second clock buffer 243, a first divider 244, a second divider 245, an internal clock driver 246, an I/O controller 247, and a data path controller 248. The first clock buffer 241 may receive and buffer the clock signals CK_t and CK_c. The clock enablement signal generator 242 may generate a clock enablement signal after the clock signals CK_t and CK_c buffered by the first clock buffer 241 are activated. The second clock buffer 243 may receive and buffer data clock signals WCK and WCKB for input and output of the data. The first divider 244 may divide the data clock signals WCK and WCKB buffered by the second clock buffer 243. The second divider 245 may receive and divide an output signal of the first divider 244. The internal clock driver 246 may receive and divide an output signal of the first divider 244 to generate an internal data clock signal IWCK[0:3]. The I/O controller 247 may receive a signal divided by the second divider 245 and the internal data clock signal IWCK[0:3] generated by the internal clock driver 246 to control the input and output of the data. The data path controller 248 may control a data path used in the input and output of the data based on a signal outputted from the I/O controller 247 and the internal data clock signal IWCK[0:3] generated by the internal clock driver 246.

The data I/O circuit 205 may include a receiver 251, a deserializer 252, a write driver 253, a write multiplexer 254, a read multiplexer 255, a read driver 256, a serializer 257, and a transmitter 258. The receiver 251 may be synchronized with the internal data clock signal IWCK[0:3] to receive transmission data DQ based on a data reference voltage VREF_DQ. The deserializer 252 may convert the transmission data DQ inputted in series through the receiver 251 into parallel data. The write driver 253 may drive the parallel data to transmit the driven parallel data to the write multiplexer 254. The write multiplexer 254 may transmit the data driven by the write driver 253 to the DRAM core 206 using a multiplexing method with an I/O line. The read multiplexer 255 may output the data outputted from the DRAM core 206 through the I/O line to the read driver 256 using a multiplexing method during the read operation. The read driver 256 may drive the data outputted from the DRAM core 206 through the read multiplexer 255 to output the driven data to the serializer 257. The serializer 257 may convert the data outputted from the read driver 256 into serial data. The transmitter 258 may output the serial data converted by the serializer 257 as the transmission data DQ.

The DRAM core 206 may perform the read operation or the write operation for outputting or receiving the data through the data I/O circuit 205 based on the read/write control signal RD/WR_Control. The DRAM core 206 may perform the active operation, the pre-charge operation, or the refresh operation based on the row path control signal ACT/PCG/REF_Control.

What is claimed is:

1. A semiconductor device comprising:
a burst end signal generation circuit configured to generate a write burst end signal based on a write flag and a latched burst mode signal in a first burst mode and configured to generate the write burst end signal based on an internal write flag and an internal latched burst mode signal in a second burst mode; and
an auto-pre-charge control circuit configured to perform an auto-pre-charge operation based on the write burst end signal,
wherein the internal write flag is generated by shifting the write flag by a period determined based on a shift control signal,
wherein the internal latched burst mode signal is generated by shifting the latched burst mode signal by a period determined based on the shift control signal, and
wherein the shift control signal is generated based on a frequency ratio of a data clock signal to an internal clock signal.

2. The semiconductor device of claim 1, wherein a burst length determined in the second burst mode is set to be "K" times a burst length determined in the first burst mode, wherein "K" denotes a natural number which is equal to or greater than two.

3. The semiconductor device of claim 1, wherein the write flag is generated after a write latency period and a clock information setup period elapse from a time when a write operation is performed in the first burst mode or in the second burst mode.

4. The semiconductor device of claim 3, wherein the clock information setup period is determined based on a frequency ratio of a data clock signal to an internal clock signal.

5. The semiconductor device of claim 1,
wherein the shift control signal includes first to $J^{th}$ shift control signals; and
wherein one of the first to $J^{th}$ shift control signals is activated based on the frequency ratio of the data clock signal to the internal clock signal, a bank mode for a write operation, and information on a burst length, wherein "J" denotes a natural number which is equal to or greater than two.

6. The semiconductor device of claim 1,
wherein the shift control signal includes a first shift control signal and a second shift control signal;
wherein the internal write flag is generated by shifting the write flag by a period corresponding to "N" times a cycle of an internal clock signal when the first shift control signal is generated; and
wherein the internal write flag is generated by shifting the write flag by a period corresponding to "2×N" times a cycle of the internal clock signal when the second shift control signal is generated, wherein "N" denotes a natural number which is equal to or greater than two.

7. The semiconductor device of claim 1, further comprising a burst mode signal latch circuit configured to latch a burst mode signal based on an input control signal and configured to output the latched signal of the burst mode signal as the latched burst mode signal based on an output control signal.

8. The semiconductor device of claim 7,
wherein the input control signal is generated when a write operation is performed in the first burst mode or the second burst mode; and wherein the output control signal is generated after a write latency period and a clock information setup period elapse from a time when the write operation is performed in the first burst mode or the second burst mode.

9. The semiconductor device of claim 7, wherein the burst mode signal has a first logic level when a write operation is performed in the first burst mode and has a second logic level when the write operation is performed in the second burst mode.

10. The semiconductor device of claim 1, wherein the burst end signal generation circuit is further configured to generate a read burst end signal for performing the auto-pre-charge operation based on a read flag and a burst mode signal in the first burst mode and is configured to generate the read burst end signal based on an internal read flag and an internal burst mode signal in the second burst mode.

11. The semiconductor device of claim 10, wherein the read flag is generated to perform a read operation in the first burst mode or the second burst mode.

12. The semiconductor device of claim 10,
wherein the shift control signal includes a first shift control signal and a second shift control signal;
wherein the internal read flag is generated by shifting the read flag by a period corresponding to "N" times a cycle of the internal clock signal when the first shift control signal is generated; and
wherein the internal read flag is generated by shifting the read flag by a period corresponding to "2×N" times a cycle of the internal clock signal when the second shift control signal is generated, wherein "N" denotes a natural number which is equal to or greater than two.

13. A semiconductor device comprising:
a flag shift circuit configured to shift a write flag by a period determined based on a shift control signal to generate an internal write flag;
a burst mode signal latch circuit configured to latch a burst mode signal based on an input control signal and configured to output the latched signal of the burst mode signal as a latched burst mode signal based on an output control signal;
a burst mode signal shift circuit configured to shift the latched burst mode signal by a period determined based on the shift control signal to generate an internal latched burst mode signal; and
a burst end signal generation circuit configured to generate a write burst end signal based on the write flag and the latched burst mode signal in a first burst mode and configured to generate the write burst end signal based on the internal write flag and the internal latched burst mode signal in a second burst mode, wherein the shift control signal is generated based on a bank mode for a write operation and information on a burst length.

14. The semiconductor device of claim 13,
wherein the shift control signal includes first to $J^{th}$ shift control signals; and
wherein one of the first to $J^{th}$ shift control signals is generated based on a frequency ratio of a data clock signal to an internal clock signal, the bank mode for the write operation, and the information on the burst length, wherein "J" denotes a natural number which is equal to or greater than two.

15. The semiconductor device of claim 13,
wherein the shift control signal includes a first shift control signal and a second shift control signal;
wherein the internal write flag is generated by shifting the write flag by a period corresponding to "N" times a cycle of an internal clock signal when the first shift control signal is generated; and
wherein the internal write flag is generated by shifting the write flag by a period corresponding to "2×N" times a cycle of the internal clock signal when the second shift control signal is generated, wherein "N" denotes a natural number which is equal to or greater than two.

16. The semiconductor device of claim 13,
wherein the input control signal is generated when a write operation is performed in the first burst mode or the second burst mode; and
wherein the output control signal is generated after a write latency period and a clock information setup period elapse from a time when the write operation is performed in the first burst mode or the second burst mode.

17. The semiconductor device of claim 13, wherein the burst mode signal has a first logic level when a write operation is performed in the first burst mode and has a second logic level when the write operation is performed in the second burst mode.

18. The semiconductor device of claim 13, wherein the write flag is generated after a write latency period and a clock information setup period elapse from a time when a write operation is performed in the first burst mode or the second burst mode.

19. A semiconductor device comprising:
a flag shift circuit configured to shift a read flag by a period determined based on a shift control signal to generate an internal read flag;
a burst mode signal shift circuit configured to shift a burst mode signal by a period determined based on the shift control signal to generate an internal burst mode signal; and
a burst end signal generation circuit configured to generate a read burst end signal based on the read flag and the burst mode signal in a first burst mode and configured to generate the read burst end signal based on the internal read flag and the internal burst mode signal in a second burst mode, wherein the shift control signal is generated based on a bank mode for a read operation and information on a burst length.

20. The semiconductor device of claim 19,
wherein the shift control signal includes first to $J^{th}$ shift control signals; and
wherein one of the first to $J^{th}$ shift control signals is generated based on a frequency ratio of a data clock signal to an internal clock signal, the bank mode for the read operation, and the information on the burst length, wherein "J" denotes a natural number which is equal to or greater than two.

21. The semiconductor device of claim 19,
wherein the shift control signal includes a first shift control signal and a second shift control signal;
wherein the internal read flag is generated by shifting the read flag by a period corresponding to "N" times a cycle of an internal clock signal when the first shift control signal is generated; and
wherein the internal read flag is generated by shifting the read flag by a period corresponding to "2×N" times a cycle of the internal clock signal when the second shift control signal is generated, wherein "N" denotes a natural number which is equal to or greater than two.

22. The semiconductor device of claim 19, wherein the burst mode signal has a first logic level when a read operation is performed in the first burst mode and has a second logic level when the read operation is performed in the second burst mode.

23. The semiconductor device of claim 19, wherein the read flag is generated to perform a read operation in the first burst mode or the second burst mode.

\* \* \* \* \*